United States Patent
Itagaki et al.

(10) Patent No.: US 8,274,078 B2
(45) Date of Patent: Sep. 25, 2012

(54) METAL OXYNITRIDE SEMICONDUCTOR CONTAINING ZINC

(75) Inventors: Naho Itagaki, Yokohama (JP); Tatsuya Iwasaki, Machida (JP); Masatoshi Watanabe, Isehara (JP); Toru Den, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 205 days.

(21) Appl. No.: 12/532,185

(22) PCT Filed: Apr. 23, 2008

(86) PCT No.: PCT/JP2008/058306
§ 371 (c)(1),
(2), (4) Date: Sep. 21, 2009

(87) PCT Pub. No.: WO2008/133345
PCT Pub. Date: Nov. 6, 2008

(65) Prior Publication Data
US 2010/0109002 A1  May 6, 2010

(30) Foreign Application Priority Data

Apr. 25, 2007  (JP) ................. 2007-115634
Nov. 6, 2007   (JP) ................. 2007-288689
Apr. 18, 2008  (JP) ................. 2008-109054

(51) Int. Cl.
*H01L 29/10* (2006.01)

(52) U.S. Cl. ............... 257/43; 257/76; 257/78; 257/613; 257/614; 257/E21.006; 257/E29.296

(58) Field of Classification Search .............. 257/43, 257/E21.006, E29.296, 76, 78, 613, 614
See application file for complete search history.

(56) References Cited

U.S. PATENT DOCUMENTS

| | | | |
|---|---|---|---|
| 4,695,432 A | 9/1987 | Colin et al. | 422/98 |
| 4,983,360 A * | 1/1991 | Merdrignac et al. | 422/90 |
| 6,527,858 B1 * | 3/2003 | Yoshida et al. | 117/108 |
| 6,617,054 B2 * | 9/2003 | Hosokawa | 428/690 |
| 7,411,209 B2 | 8/2008 | Endo et al. | 257/43 |
| 7,473,942 B2 | 1/2009 | Iwasaki et al. | 257/103 |
| 7,545,010 B2 | 6/2009 | Ichihara et al. | 257/414 |
| 2006/0102907 A1 * | 5/2006 | Lee et al. | 257/72 |

(Continued)

FOREIGN PATENT DOCUMENTS

| | | |
|---|---|---|
| JP | 2002-076356 A | 3/2002 |
| WO | WO 2006/051993 A2 | 5/2006 |

OTHER PUBLICATIONS

Bacher et al., "Structure and crystallization of zinc and germanium oxynitrides determined by neutron diffraction", Materials Chemistry and Physics 21 (1989) pp. 223-235 (Abstract).*

(Continued)

*Primary Examiner* — Jay C Kim
(74) *Attorney, Agent, or Firm* — Fitzpatrick, Cella, Harper & Scinto

(57) ABSTRACT

Provided is an oxynitride semiconductor comprising a metal oxynitride. The metal oxynitride contains Zn and In and at least one element selected from the group consisting of Ga, Sn, Mg, Si, Ge, Y, Ti, Mo, W, and Al. The metal oxynitride has an atomic composition ratio of N, N/(N+O), of 7 atomic percent or more to 80 atomic percent or less.

5 Claims, 26 Drawing Sheets

U.S. PATENT DOCUMENTS

| | | | |
|---|---|---|---|
| 2006/0108636 A1* | 5/2006 | Sano et al. | 257/347 |
| 2009/0065771 A1 | 3/2009 | Iwasaki et al. | 257/43 |
| 2009/0134427 A1 | 5/2009 | Oike et al. | 257/103 |
| 2009/0174012 A1 | 7/2009 | Iwasaki | 257/410 |
| 2009/0189153 A1 | 7/2009 | Iwasaki et al. | 257/43 |
| 2009/0269880 A1 | 10/2009 | Itagaki et al. | 438/104 |

OTHER PUBLICATIONS

K. Nomura et al., "Room-temperature fabrication of transparent flexible thin-film transistors using amorphous oxide semiconductors," Nature, vol. 432, Nov. 25, 2004, pp. 488-492.

L. Wang et al., "High-performance transparent inorganic-organic hybrid thin-film n-type transistors," Nature Materials, vol. 5, Nov. 2006, pp. 893-900 (with erratum).

L. Wang et al., Supporting Information for "High-performance transparent inorganic-organic hybrid thin-film n-type transistors," Nature Materials, vol. 5, Nov. 2006, pp. 1-5.

C.L.E. dit Picard et al., "Detection of $NH_3$ and $H_2S$ with thick film semiconductor sensors based on $Cd_{2-x}GeO_{4-x-3y}N_{2y}$ oxynitrides," Sensors and Actuators, vol. B42 (1997), pp. 47-51.

* cited by examiner

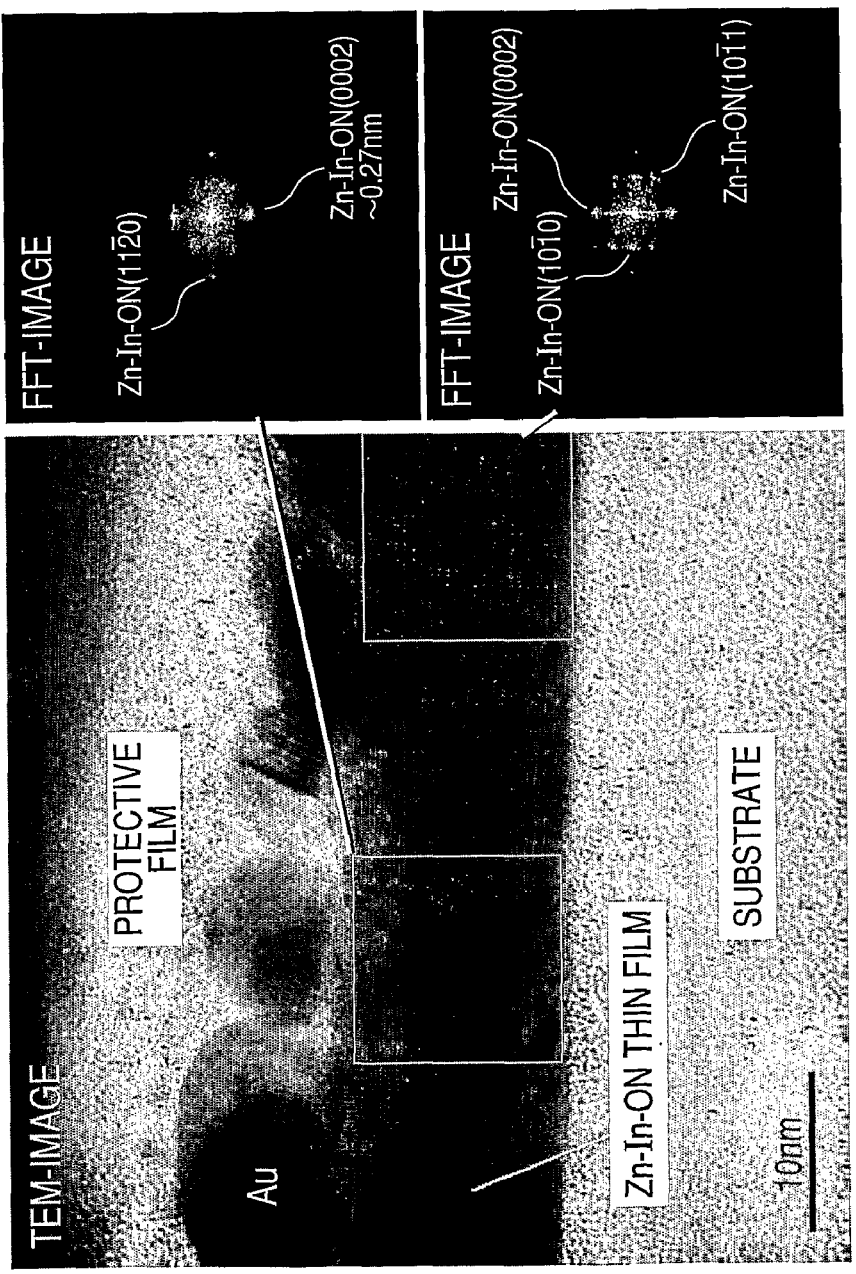

FIG. 10
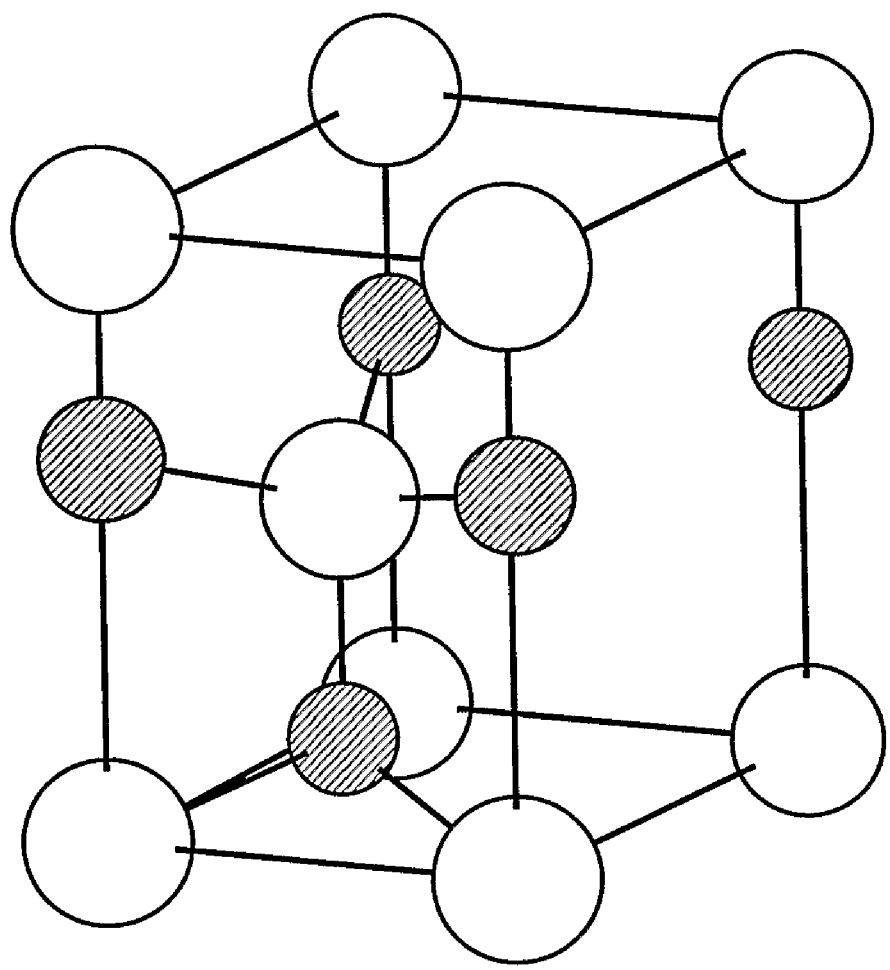
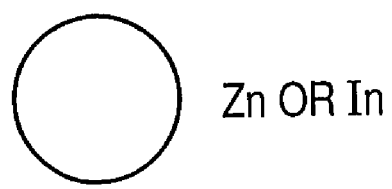 Zn OR In
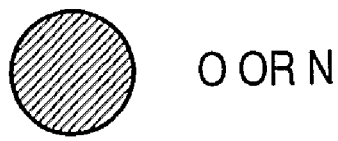 O OR N

FIG. 26A
FIG. 26B
CASTEP BAND STRUCTURE
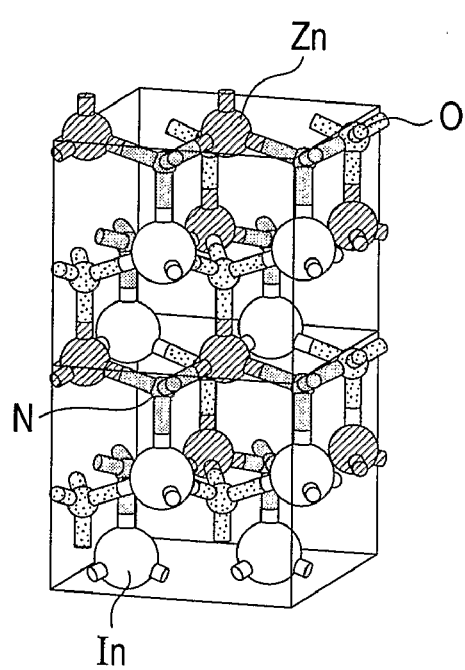
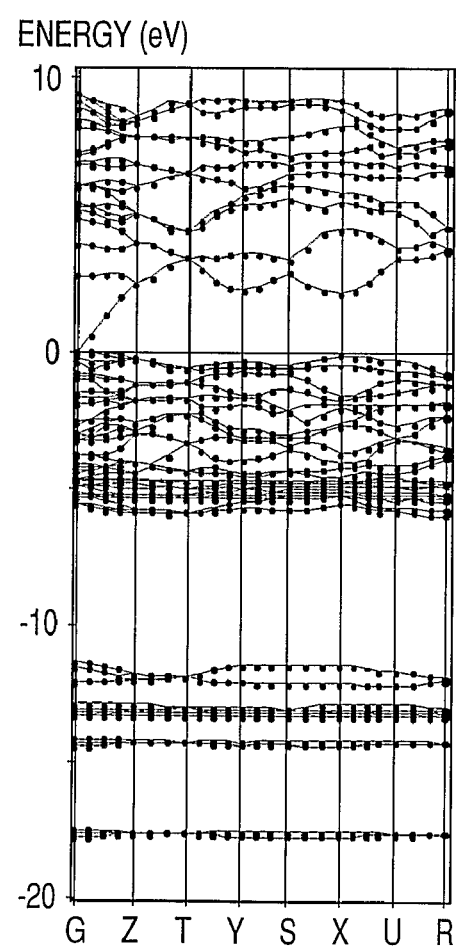

FIG. 29
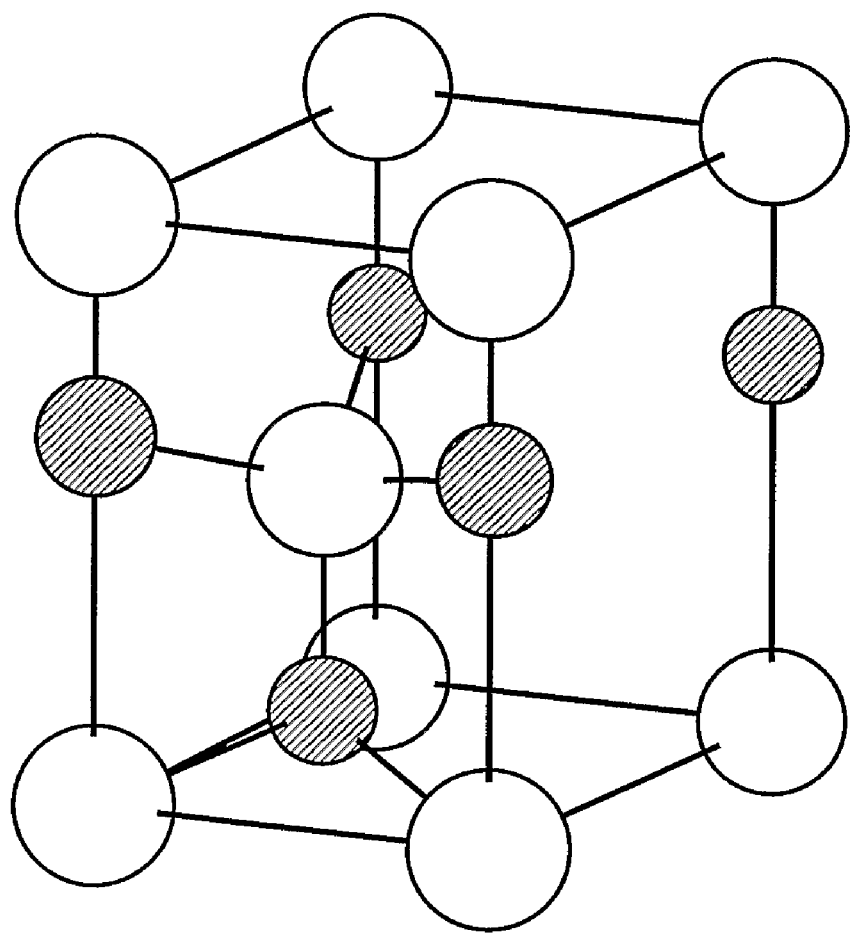
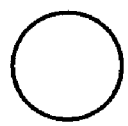 In, Ga, Sn, Mg, Si, Ge, Y, T, i, Mo, W, OR Al
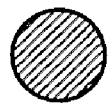 N OR O

METAL OXYNITRIDE SEMICONDUCTOR CONTAINING ZINC

TECHNICAL FIELD

The present invention relates to a metal oxynitride semiconductor.

BACKGROUND ART

In order to realize semiconductor devices having excellent characteristics, such as a thin film transistor, a thin film diode, and a solar cell, it is essential for a semiconductor film used as an active layer to have a high carrier (electron or hole) mobility.

A semiconductor film whose mobility is high, for example, a semiconductor film made of polycrystalline Si, is normally formed by a high-temperature process. Therefore, there is a problem in that a low-cost substrate such as a resin substrate which is exemplified by a low-softening point glass substrate or a plastic substrate cannot be used.

In order to solve this problem, there is developed a technology called a low-temperature process, for irradiating an amorphous Si film with a high-power pulse laser beam to form a polycrystalline Si film, so a relatively low-cost heat-resistant glass can be used. However, the stability of the laser beam is not sufficient, so it is difficult to uniformly process the entire surface of a large-area substrate. Therefore, it is difficult to obtain multiple semiconductor devices having uniform characteristics on the same substrate. There is also a problem in that a throughput is low because an irradiation area of the laser beam is small.

In recent years, an oxide semiconductor thin film which is made of, for example, Zn—O, In—Ga—Zn—O, or In—O and can be formed at low temperature without laser beam irradiation has been under active development.

It has been known that the hole mobility of the oxide semiconductor thin film formed even at room temperature is a relatively high value equal to or larger than 10 cm$^2$/Vs. There have been made attempts to form a flexible thin film transistor (TFT) on a flexible substrate such as a plastic substrate or a plastic film.

For example, a technology for a TFT using as the active layer an oxide film containing Zn—O as a main component is described in Japanese Patent Application Laid-Open No. 2002-76356.

A technology for a TFT using as the active layer an amorphous oxide film which is formed at room temperature and contains In, Zn, and Ga is described in *Nature*, Vol. 432, 25, Nov. 2004 (488-492).

A TFT using as the active layer an oxide thin film which is formed at room temperature and contains In—O as a main component is described in *Nature Materials*, Vol. 5, November 2006 (893-900).

In the case of the oxide semiconductor described in *Nature*, Vol. 432, 25, Nov. 2004 (488-492), the hole mobility value thereof at room temperature is in a range of 5 cm$^2$/Vs to 10 cm$^2$/Vs. The field effect mobility value of the TFT using the oxide semiconductor for active layer is in a range of 6 cm$^2$/Vs to 9 cm$^2$/Vs. Therefore, there have been expected applications to an active matrix desired for a flat panel display using a liquid crystal device or an electroluminescence device. However, when the above-mentioned material is used, it is difficult to further increase the mobility. Thus, there is a limitation on high-speed operation, so its application is limited.

In contrast, in the case of the oxide semiconductor described in *Nature Materials*, Vol. 5, November 2006 (893-900), the hole mobility value thereof at room temperature is approximately 30 cm$^2$/Vs. The field effect mobility value of the TFT using the oxide semiconductor for an active layer is in a range of 10 cm$^2$/Vs to 140 cm$^2$/Vs depending on the gate insulating film material.

According to the studies made by the present inventors, it is found that an In—O film formed at room temperature has low environmental stability and the resistivity thereof significantly changes when the In—O film is left in the atmosphere. For example, when the In—O film is left in the atmosphere at a temperature of 20° C. and a humidity of 50% for a month, a reduction of one or two orders of magnitude in resistivity is observed. The aforementioned reduction in resistivity is observed even in the case of the oxide semiconductor containing Zn—O as a main component as described in Japanese Patent Application Laid-Open No. 2002-76356.

In the case of the oxide semiconductor described in each of Japanese Patent Application Laid-Open No. 2002-76356, *Nature*, Vol. 432, 25, Nov. 2004 (488-492), and *Nature Materials*, Vol. 5, November 2006 (893-900), the band gap thereof is a large value of approximately 3 eV in terms of optical characteristics. Therefore, it is difficult to say that the oxide semiconductor is suitable for a light receiving device for which photosensitivity is required in a visible light region, such as a visible light receiving device or a solar cell. Thus, its application fields are limited.

DISCLOSURE OF THE INVENTION

The present invention has been made to solve the above-mentioned problems. An object of the present invention is to provide a semiconductor which has both high mobility and environmental stability and includes an oxynitride, and a semiconductor device using the semiconductor.

Another object of the present invention is to provide a semiconductor which has photo sensitivity in a visible light region and includes an oxynitride, and a semiconductor device using the semiconductor.

In order to achieve the above objects, the present inventors have focused on and intensively studied the oxynitride semiconductor. As a result, the present invention has been completed. The present invention as claimed is an oxynitride semiconductor comprised of a metal oxynitride which contains Zn and In and at least one element selected from the group consisting of Ga, Sn, Mg, Si, Ge, Y, Ti, Mo, W, and Al; and the metal oxynitride has an atomic composition ratio of N, N/(N+O), of 7 atomic percent or more to 80 atomic percent or less.

Further, the oxynitride semiconductor according to the present invention is a crystal having an atomic arrangement of a wurtzite structure.

Further, in the oxynitride semiconductor according to the present invention, the metal oxynitride has a band gap of 1 eV or more to 2 eV or less.

Further, in the oxynitride semiconductor according to the present invention, the metal oxynitride has an atomic composition ratio of Zn to the total number of metal atoms of 50 atomic percent or more.

Further, in the oxynitride semiconductor according to the present invention, the metal oxynitride includes at least Ga.

Further, in the oxynitride semiconductor according to the present invention, the metal oxynitride includes at least Ge.

Further, in the oxynitride semiconductor according to the present invention, the metal oxynitride includes at least Si.

According to the present invention, it is possible to provide an oxynitride semiconductor having a high carrier (electron or hole) mobility, excellent environmental stability, and photo-sensitivity in a visible light region.

It is also possible to provide a semiconductor device such as a high-speed TFT, a high-speed diode, a high-efficiency light receiving device, or a high-efficiency solar cell, each of which has an active layer using the oxynitride semiconductor.

BRIEF DESCRIPTION OF THE DRAWINGS

FIG. 8A is a cross-sectional TEM photograph illustrating the oxynitride film produced in Example 1 of the present invention. FIGS. 8B and 8C are the fast-Fourier transform (FFT) patterns of the film.

FIG. 10 illustrates an atomic arrangement of a wurtzite structure.

FIGS. 26A and 26B illustrate an example of a stable ZnInON crystal structure (FIG. 26A) and a band structure thereof (FIG. 26B).

FIG. 29 illustrates an atomic arrangement of a wurtzite structure.

BEST MODE FOR CARRYING OUT THE INVENTION

Hereinafter, an oxynitride semiconductor according to an embodiment of the present invention will be described.

Up to now, an oxynitride is normally used as an insulating film or the like of a semiconductor device such as a TFT or a light receiving device. According to the findings of the inventors of the present invention, an oxynitride semiconductor described below also acts as an active layer of the semiconductor device.

Figure 1:
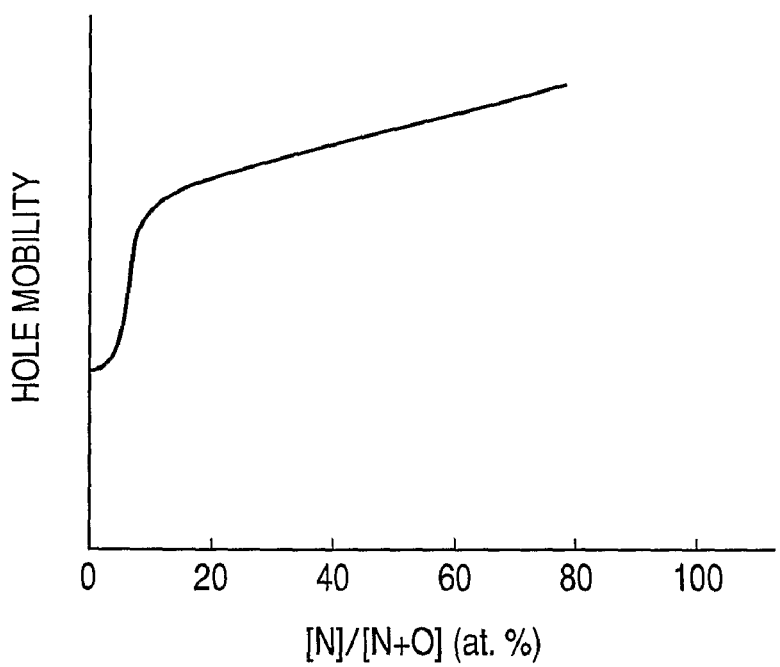
FIG. 1 is a graph illustrating a relationship between an N concentration and a hole mobility in an oxynitride film according to the present invention.

The present inventors have evaluated hole mobilities of oxynitride films of various metals. As a result, the following results are obtained. In the case of an oxynitride which contains Zn and at least one element selected from the group consisting of In, Ga, Sn, Mg, Si, Ge, Y, Ti, Mo, W, and Al, a high hole mobility value of 10 $cm^2/Vs$ to 30 $cm^2/Vs$ is obtained depending on a metal atomic composition ratio of the oxynitride film. FIG. 1 is a graph obtained by plotting hole mobilities to N concentrations in different oxynitride films. As is apparent from FIG. 1, the N-concentration in the film which is expressed by "[N]/[N+O]" significantly changes at 7 atomic percent or more. The reason for this is not obvious, but the atom number density in the oxynitride film may increase by the introduction of nitrogen smaller in ion radius compared with oxygen. Therefore, it is expected that the distance between metal atoms in the oxynitride is shorter than the distance between metal atoms in the oxide. This may affect the hole mobility.

Figure 2:
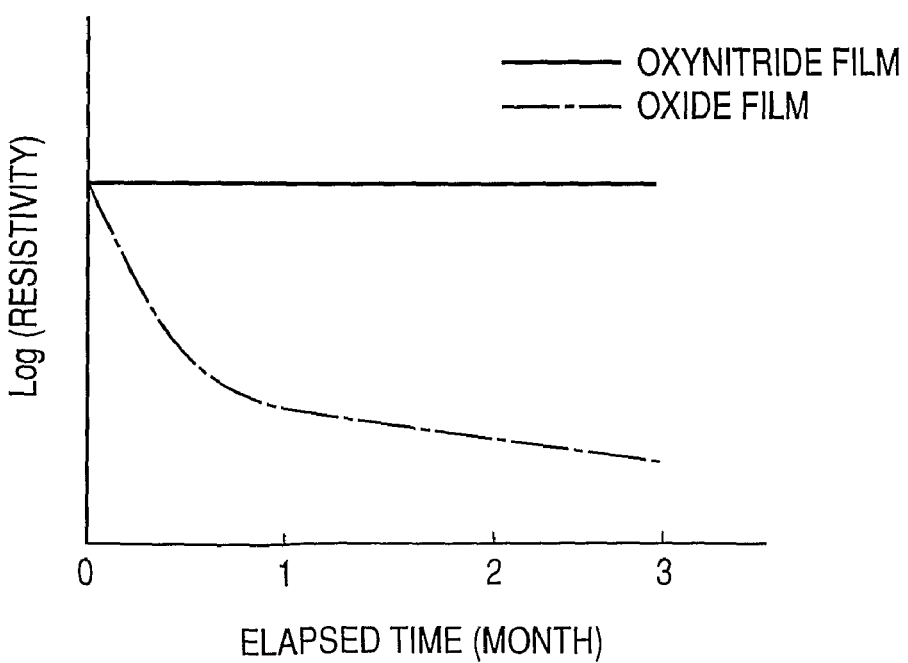
FIG. 2 is a graph illustrating a temporal change in resistivity in the case where the oxynitride film according to the present invention is left in the atmosphere at a temperature of 20° C. and a humidity of 50%.

A conventional oxide semiconductor whose mobility is high, such as an In—O semiconductor, has low environmental stability. It is also found that the environmental stability is improved by the introduction of N. FIG. 2 is a graph illustrating temporal changes in resistivities in the case where an oxynitride and an oxide, each of which contains Zn, are left in the atmosphere at a temperature of 20° C. and a humidity of 50%. In the case of the oxide, it is found that a reduction in resistivity is observed from immediately after film formation and the resistivity is reduced by approximately one to three orders of magnitude after three months depending on its composition. In contrast, in the case of oxynitride, a change in resistivity is not observed even after the oxynitride has been left for three months irrespective of the composition thereof.

The reason for this is not obvious. However, it is generally said that the conductivity of the oxide film is affected by humidity of a storage environments. Therefore, the improvement of humidity resistance due to the introduction of N may be one reason. Hereinafter, the reason will be described.

For example, it is known that the distance between atoms in $SiO_2$ is relatively large and thus transmittance of $H_2O$ is high. It is said that the dipole moment of $H_2O$ is large particularly in an oxide film. Therefore, this may cause increase in $OH^-$ and $H^+$ ion generation rates in the oxide film to reduce the conductivity thereof. In contrast, the distance between atoms in the oxynitride film is smaller than the distance between atoms in the oxide film, and thus the transmittance of $H_2O$ is small. It is known that the humidity resistance is improved by the introduction of N into an $SiO_2$ film normally used as an insulating film or a protective layer. Therefore, the improvement of humidity resistance may be one of the reasons why the oxynitride film containing Zn as a main component according to the present invention has the high environmental stability.

When the band gap of the oxynitride is derived by optical absorption spectrum, a value of 1 eV or more to 2 eV or less is obtained depending on the composition thereof. Therefore, it is found that the oxynitride is suitable for a light receiving device for which photo-sensitivity is required in a visible light region. Note that the band gap in the present invention is a band gap derived from optical absorption spectrum.

The present invention has been made based on the findings described above.

The metal oxynitride semiconductor according to the present invention may be the oxynitride containing at least Zn. When the oxynitride containing at least Zn is used, a semiconductor device whose temporal stability is high can be obtained. In particular, the nitrogen concentration expressed by N/(N+O) (also referred to as "atomic composition ratio of N" or "N-atom ratio") in the oxynitride film is desirably set to a value equal to or larger than 7 atomic percent in view of mobility. The upper limit value of the N concentration is not particularly limited. A pressure of a film formation apparatus capable of forming a large-area film is in a range of $1\times10^{-4}$ Pa to $1\times10^{-3}$ Pa. Therefore, even when oxygen is not intentionally introduced into a film formation atmosphere, oxygen is incorporated in the oxynitride film. According to the findings of the present inventors, when the oxynitride film is formed using the film formation apparatus as described above at room temperature, the upper limit value of the nitrogen concentration expressed by N/(N+O) (also referred to as "atomic composition ratio of N" or "N-atom ratio") is 80 atomic percent. In order to increase the nitrogen concentration expressed by N/(N+O) to 80 atomic percent or more, an ultra-high-vacuum film formation apparatus is necessary, thereby significantly increasing apparatus cost. Therefore, the nitrogen concentration expressed by N/(N+O) (also referred to as "atomic composition ratio of N" or "N-atom ratio") in the desirable oxynitride film according to the present invention is 7 atomic percent or more to 80 atomic percent or less.

In view of mobility, at least one element selected from the group consisting of In, Ga, Sn, Mg, Si, Ge, Y, Ti, Mo, W, and Al is desirably used as an additional constituent element. In particular, when In is contained as the constituent element, a high hole mobility equal to or larger than 30 $cm^2/Vs$ is obtained. In view of controllability of carrier concentration, the desirable constituent element is Ga. According to the studies made by the present inventors, a low carrier concentration can be stably obtained in the case of an oxynitride whose constituent elements are particularly In, Ga, and Zn. In view of controllability of carrier concentration, Ge and Si are also used as a desirable constituent element. In particular, in the case of an oxynitride containing Ge and Zn as constituent elements or an oxynitride containing Si and Zn as constituent elements, a low carrier concentration can be stably obtained.

Figure 3:
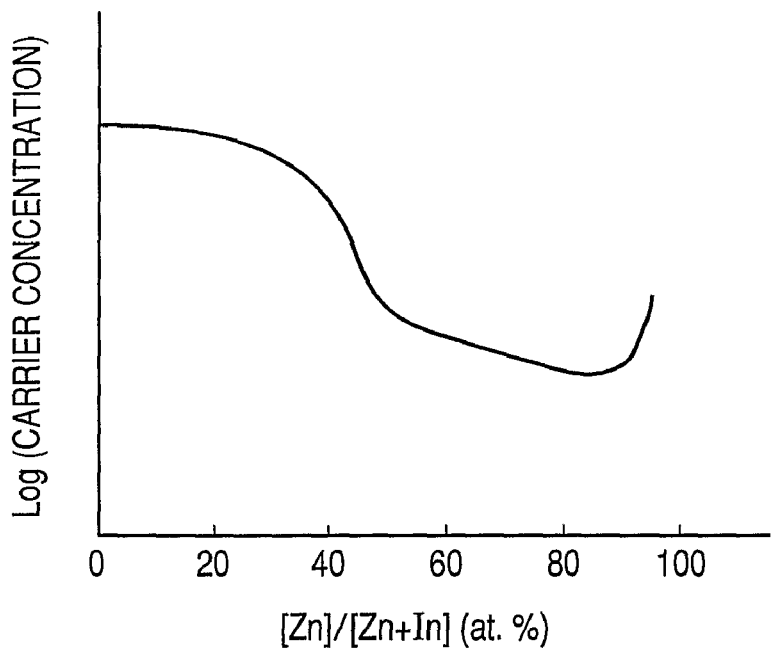
FIG. 3 is a graph obtained by plotting carrier concentrations with respect to different Zn ratios in the oxynitride film according to the present invention.

The atomic composition ratio in the oxynitride can be set according to usage. When the oxynitride film is used as the active layer of a semiconductor device such as a TFT, a diode, or a solar cell, a desirable ratio of Zn atom to the tonal number of metal atoms (also referred to as "atomic composition ratio of Zn" or "Zn-atom ratio") is equal to or larger than 50 atomic percent. FIG. 3 is a graph obtained by plotting carrier concentrations to different Zn ratios in a Zn—In—ON film and a Zn—Sn—ON film. As is apparent from FIG. 3, when the ratio of Zn atom (also referred to as "atomic composition ratio of Zn" or "Zn-atom ratio") is equal to or larger than 50 atomic percent, the carrier concentration decreases. Therefore, when the oxynitride film is used as the active layer of the semiconductor device, for example, when the oxynitride film is used for the TFT, there is an advantage in that the off-current thereof can be reduced.

Figure 4:
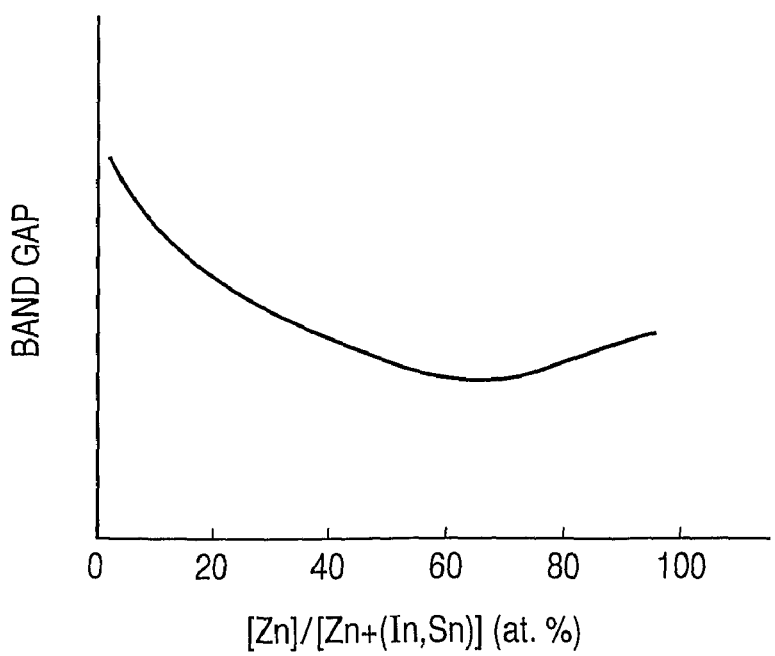
FIG. 4 illustrates band gaps with respect to different Zn ratios in the oxynitride film according to the present invention.

FIG. 4 illustrates band gap to different Zn ratios, which is obtained by optical absorption spectral analysis. For example, in the case of the Zn—In—ON film, when the N ratio is equal to or larger than 20 atomic percent and the Zn ratio is equal to or larger than 50 atomic percent, the band gap is in a range of 1.0 eV to 1.5 eV. Therefore, it can be said that the oxynitride film is particularly suitable for the light receiving device for which the photo-sensitivity in the visible light region is required.

According to the studies made by the present inventors, it was found that, when the oxynitride film has a hexagonal structure, in particular, stability (environmental stability and thermal stability) is high. The reason for this is not obvious. However, the reason may be as follows. In some oxynitrides having a crystal structure (including amorphous structure) except the crystal structure described above, a reduction in amount of nitrogen contained in the film which is caused by heat treatment or a temporal change in amount of nitrogen contained in the film is observed. In contrast, in the oxynitride having the crystal structure described above, a change in amount of nitrogen contained in the film is not observed and thus nitrogen is stably present. The results obtained by crystal structure analysis and electronic state calculation exhibit that stability may be high particularly in the case where the oxynitride has the atomic configuration of a wurtzite structure.

Figure 11:
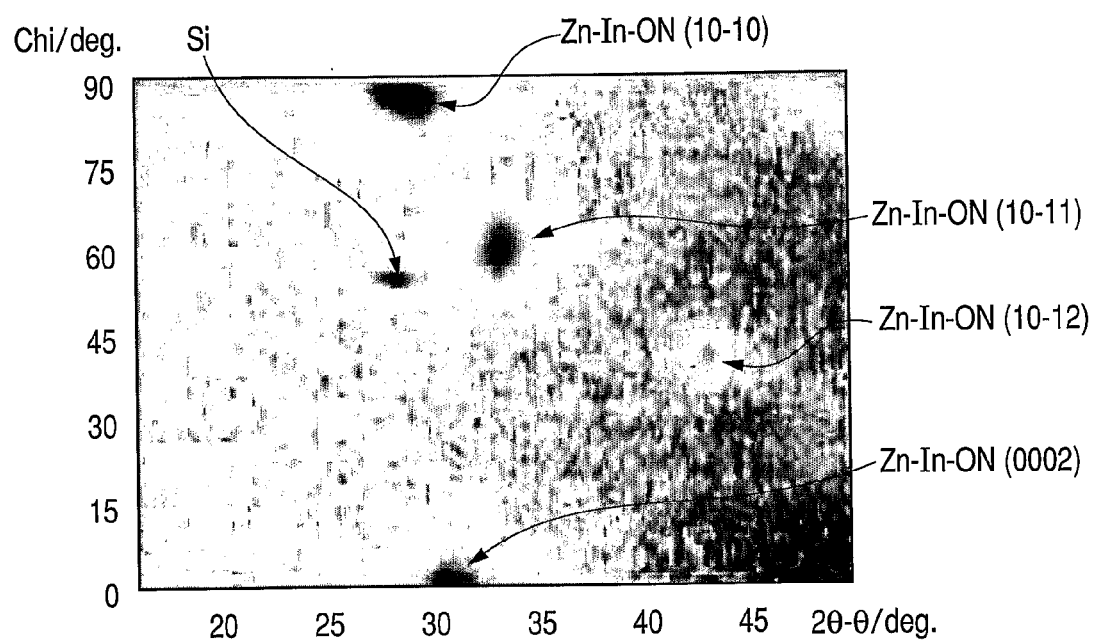
FIG. 11 illustrates a two-dimensional X-ray diffraction pattern of a Zn—In—O thin film.
Figure 12:
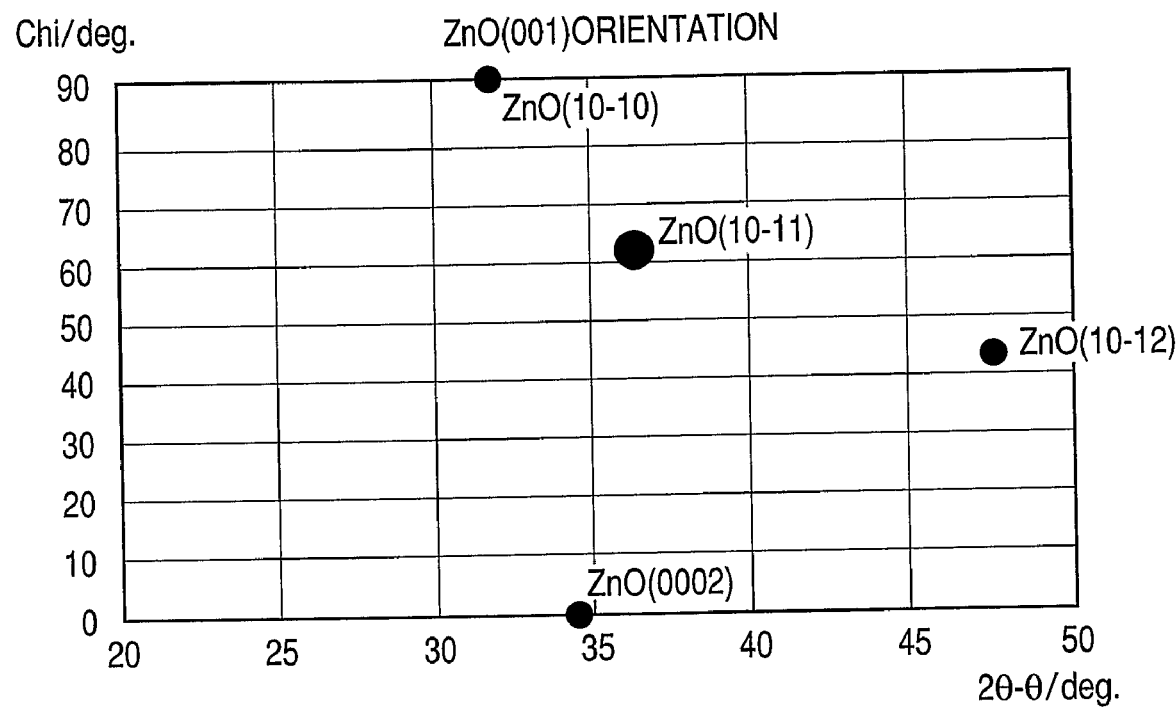
FIG. 12 illustrates a simulation of a two-dimensional X-ray diffraction pattern of ZnO having the wurtzite structure.
Figure 27:
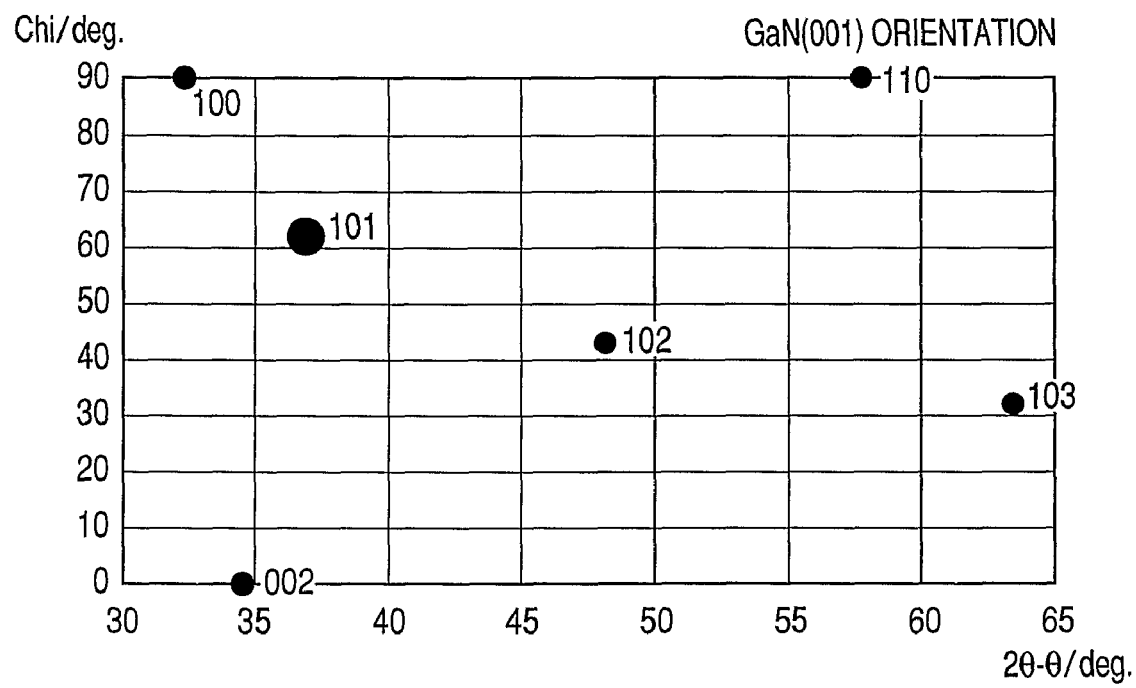
FIG. 27 illustrates a simulation of a two-dimensional X-ray diffraction pattern of GaN having the wurtzite structure.
Figure 28:
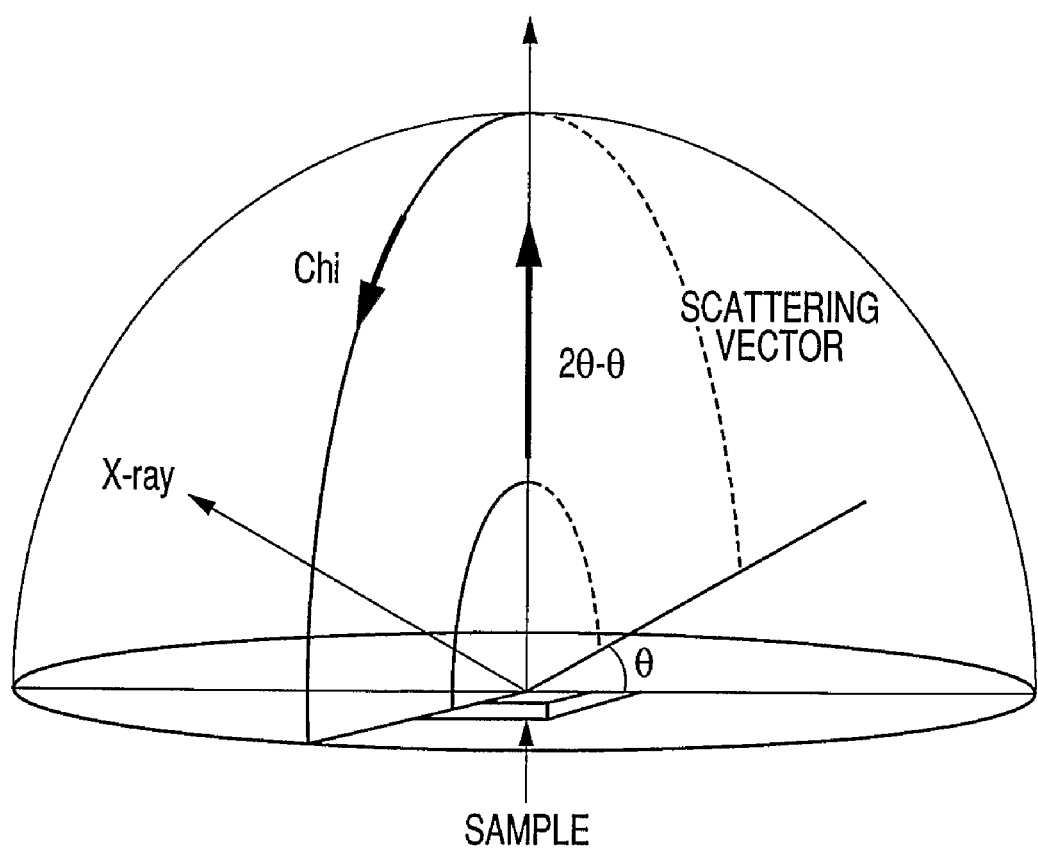
FIG. 28 illustrates a geometric arrangement at the time of measurement of a two-dimensional X-ray diffraction pattern.

FIGS. 11, 14, 18, 23, and 24 illustrate typical two-dimensional X-ray diffraction patterns of oxynitride films according to this embodiment. The two-dimensional X-ray diffraction pattern is obtained by accumulating diffraction intensities obtained by θ-2θ measurement repeated while a sample is being tilted, so the phase of an oriented film can be identified. In each of FIGS. 11, 14, 18, 23, and 24, the abscissa indicates 2θ (θ: X-ray incident angle) and the ordinate indicates substrate tilt angle Chi. FIG. 28 illustrates a geometric configuration of X-ray diffraction measurement. The diffraction peak depends on the composition of the oxynitride. When Chi (substrate tilt angle) is approximately 0 degree, a diffraction peak is observed at around 2θ=30 to 35 degrees. When Chi is approximately 32 degrees, a diffraction peak is observed at around 2θ=56 to 64 degrees. When Chi is approximately 43 degrees, a diffraction peak is observed at around 2θ=43 to 48 degrees. When Chi is approximately 62 degrees, a diffraction peak is observed at around 2θ=33 to 37 degrees. When Chi is approximately 90 degrees, diffraction peaks are observed at around 2θ=29 to 32 degrees and around 2θ=52 to 58 degrees. The diffraction peaks have the same patterns as in the results obtained by simulation of ZnO and GaN which are (001) oriented and have the wurtzite structure (FIGS. 12 and 27). Therefore, it is apparent that the entire thin film is comprised of the oxynitride which is (001) oriented and has an atomic arrangement of the wurtzite structure as illustrated in FIG. 29. In the present invention, the crystal structure having the atomic arrangement of the wurtzite structure corresponds to that the same pattern as in the wurtzite structure described above is obtained in two-dimensional X-ray diffraction.

FIGS. 8A, 8B, and 8C illustrate a typical high-resolution TEM image of the oxynitride according to this embodiment and fast Fourier transform (FFT) patterns of the crystal lattice fringe thereof. The FFT patterns are used to obtain an FFT pattern corresponding to a hexagonal close-packed structure as viewed from [−1100] and [−12-10] directions. With respect to the lattice constants of the hexagonal close-packed structure, the a-axis (=b-axis) length is approximately 0.31 nm to 0.35 nm and the c-axis length is approximately 0.50 nm to 0.54 nm. The composition of the crystal is analyzed by an electron energy loss spectroscopy (EELS) method. As a result, it is found that the crystal has the atomic arrangement of the wurtzite structure in which cations of In, Ga, Sn, Mg, Si, Ge, Y, Ti, Mo, W, or Al and anions of O or N occupy the crystal lattice sites (see a schematic view of FIG. 29).

The oxynitride film may contain an amount of impurity that does not substantially affect film characteristics such as the mobility, the carrier concentration, and the band gap.

In a method of producing the oxynitride semiconductor according to the present invention, a substrate to be prepared is a glass substrate, a plastic substrate, a resin substrate such as a PET film, or an Si substrate. Then, the oxynitride semiconductor is formed by a sputtering method, a pulse laser deposition method, an electron beam deposition method, or a combination thereof. The substrate temperature can be set as appropriate. The oxynitride semiconductor according to the present invention can be produced even at room temperature. The desirable upper limit of the substrate temperature is lower than a glass transition temperature at which a substrate thermally deforms. For example, the desirable upper limit of temperature for a glass substrate is 450° C. or less and the desirable upper limit of temperature for a resin substrate such as a plastic substrate is 200° C. or less. At this time, a raw material gas including N atom (for example, $N_2$, $NH_3$, or NO) is introduced into the vapor phase according to a desirable nitrogen concentration to be contained in the oxynitride film. In order to increase the nitrogen concentration contained in the oxynitride film, it is effective to perform N-radical irradiation using a radical source or the like during film formation.

It is also desirable to perform heat treatment on the produced oxynitride after the process described above. The upper limit of a heat treatment temperature can be set as appropriate, but the desirable upper limit thereof is lower than a glass transition temperature at which a substrate thermally deforms. For example, it is desirable to perform heat treatment on a glass substrate at 450° C. or less and perform heat treatment on a resin substrate such as a plastic substrate at 200° C. or less. Therefore, the electrical characteristics of the oxynitride film can be stabilized to realize a semiconductor device having higher reliability. In order to effectively perform the heat treatment, a desirable temperature of an atmosphere containing any one of nitrogen, oxygen, water vapor, and carbon dioxide is equal to or larger than 150° C. A temperature range of the heat treatment can be determined as appropriate based on a heat resistance of a substrate to be used and a heat treatment time. The temperature range is desirably 150° C. or more to 450° C. or less, more desirably 150° C. or more to 350° C. or less.

Therefore, for example, when the oxynitride is used for the active layer of a TFT, there can be obtained an effect of further reducing the off-current thereof.

Figure 5:
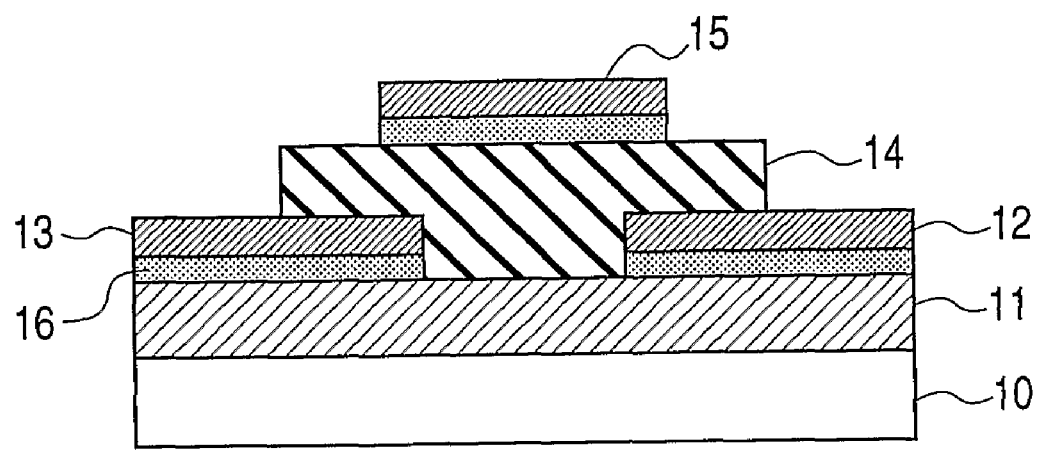
FIG. 5 is a schematic cross-sectional view illustrating a structural example of a thin film transistor according to an embodiment of the present invention.

FIG. 5 is a schematic view illustrating a structure of a TFT device according to an embodiment of the present invention. An active layer 11 is provided on a substrate 10. A source electrode 12, a drain electrode 13, a gate insulating film 14, and a gate electrode 15 are provided over the active layer 11.

The structure of a semiconductor device to which the present invention can be applied is not only the staggered (top gate) TFT as described above, but also, for example, an inverse staggered (bottom gate) TFT in which a gate insulating film and a semiconductor channel layer are provided in the stated order on a gate electrode.

The material for the source electrode 12, the drain electrode 13, and the gate electrode 15 is not particularly limited as long as the material has excellent electrical conductivity and can electrically connect with the channel layer (active layer). For example, a substrate also serving as the gate electrode, such as a silicon substrate doped with phosphorus, may be used. It is also possible to use an indium oxide film doped with tin, a transparent conductive film made of zinc oxide, or a metal film made of gold, platinum, aluminum, or nickel. An adhesion layer 16 made of titanium, nickel, or chromium for improving adhesion may be provided between the active layer and the electrodes and between the gate electrode and the gate insulating film.

The gate insulating film 14 may be any one of an alumina film having a high dielectric constant, an yttrium film having a high dielectric constant, and a laminate film thereof in addition to a silicon oxide film, a silicon nitride film, and a silicon oxynitride film, each of which is normally used.

The substrate to be used, which depends on heat treatment conditions etc., includes a glass substrate, a metal substrate, a plastic substrate, or a plastic film.

(TFT Characteristics)

First, evaluation indices of transistor operating characteristics will be described.

Figure 6:
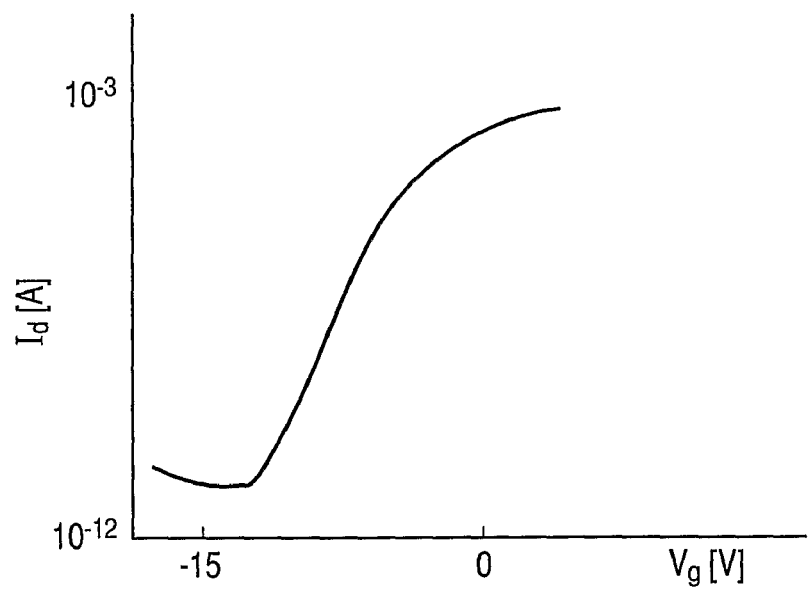
FIG. 6 is a graph illustrating a typical TFT characteristic of the thin film transistor according to the embodiment of the present invention.

FIG. 6 illustrates a typical characteristic of the thin film transistor according to the embodiment of the present invention.

When a voltage Vd of approximately 6 V is applied between the source electrode and the drain electrode, the current Id flowing between the source electrode and the drain electrode can be controlled (turned on/off) by allowing the gate voltage Vg to switch between 15 V to 5 V.

There are various evaluation indices for the transistor operating characteristics. For example, there are field effect mobility and current on/off ratio.

The field effect mobility can be obtained from characteristics in a linear region and a saturation region. For example, there is a method of producing a √Id-Vg graph based on a result of a transfer characteristic and deriving the field effect mobility from a gradient of the graph. Unless otherwise specified in this specification, this method is employed for evaluation.

The current on/off ratio can be obtained based on a ratio between a maximum value of Id and a minimum value of Id in the transfer characteristic.

When the TFT according to this embodiment is compared with a conventional TFT using an oxide semiconductor such as an In—Ga—Zn—O semiconductor or an In—O semiconductor for the active layer, the same high field effect mobility is obtained. In the case of the conventional TFT using the In—O semiconductor, the mobility is high but the environmental stability is low. In contrast, in the case of the TFT according to this embodiment, variations in TFT characteristics are small between the characteristics immediately after being produced and those after being left in the atmosphere for half a year, so the characteristics are constantly stable and excellent.

The example in which the oxynitride is used for the active layer of the TFT is described. However, the present invention is not limited to this example. For example, the present invention can be embodied for use in the active layer of, for example, a thin film diode, a light receiving device, or a solar cell.

Figure 21:
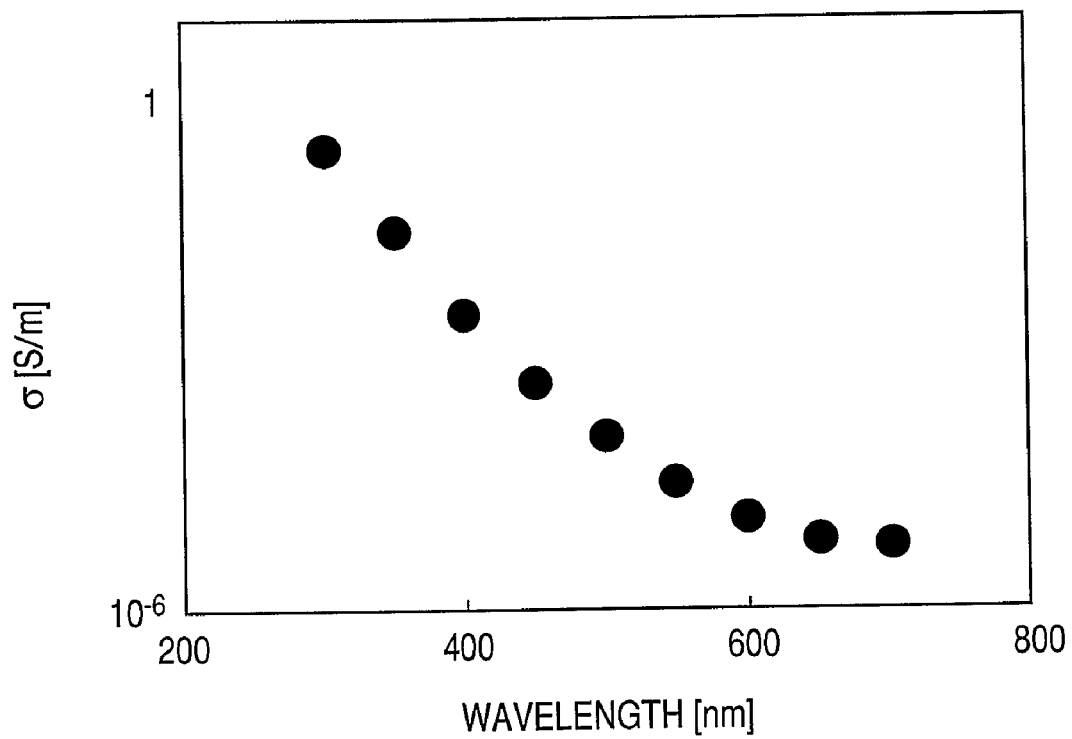
FIG. 21 is a graph illustrating a typical photoconductivity of the oxynitride film according to the embodiment of the present invention.
Figure 22:
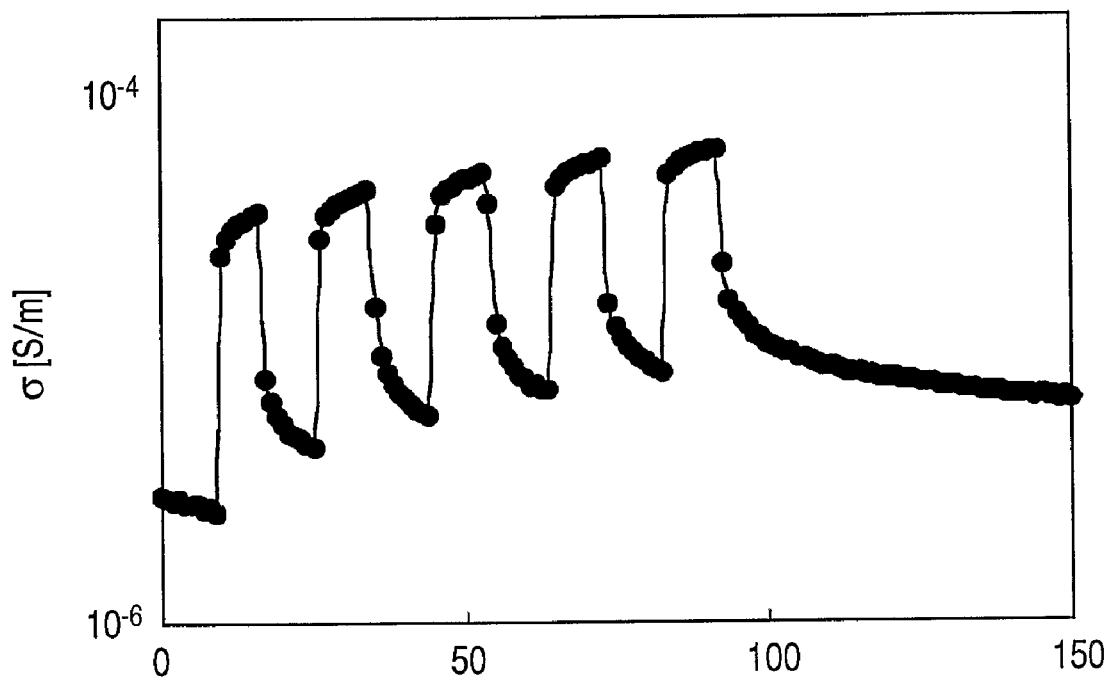
FIG. 22 is a graph illustrating a typical optical response characteristic of the oxynitride film according to the embodiment of the present invention.
Figure 23:
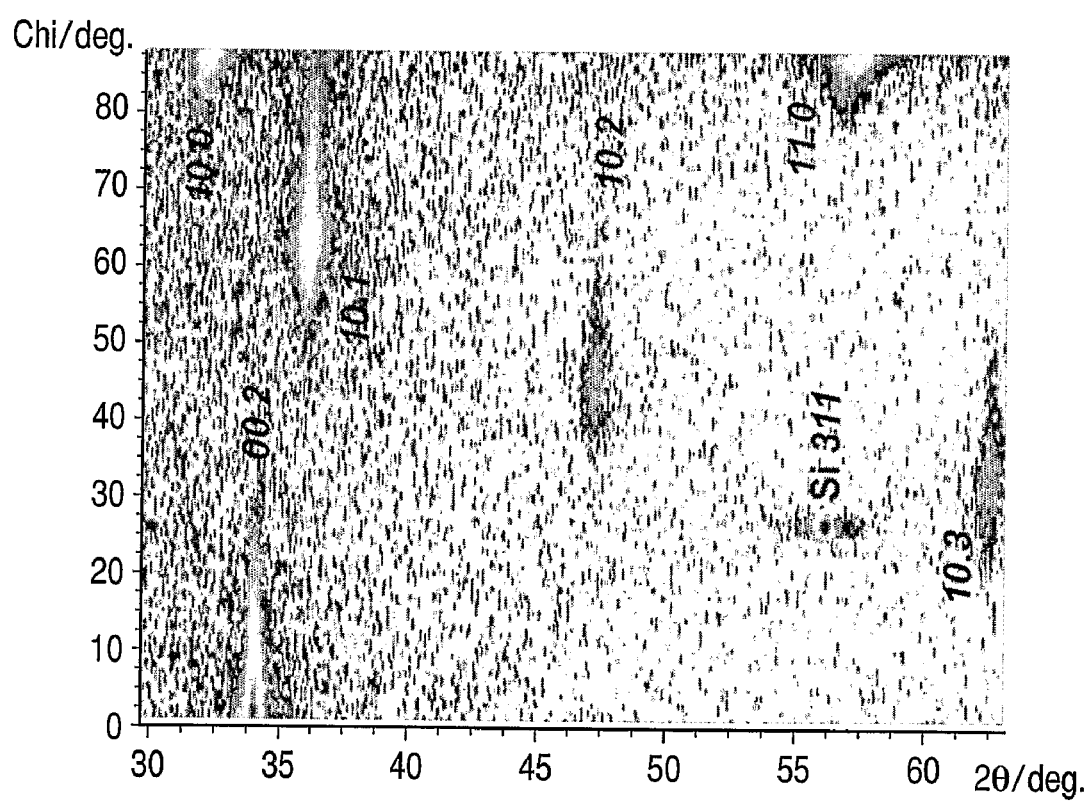
FIG. 23 illustrates a two-dimensional X-ray diffraction pattern of an oxynitride film produced in Example 10.
Figure 24:
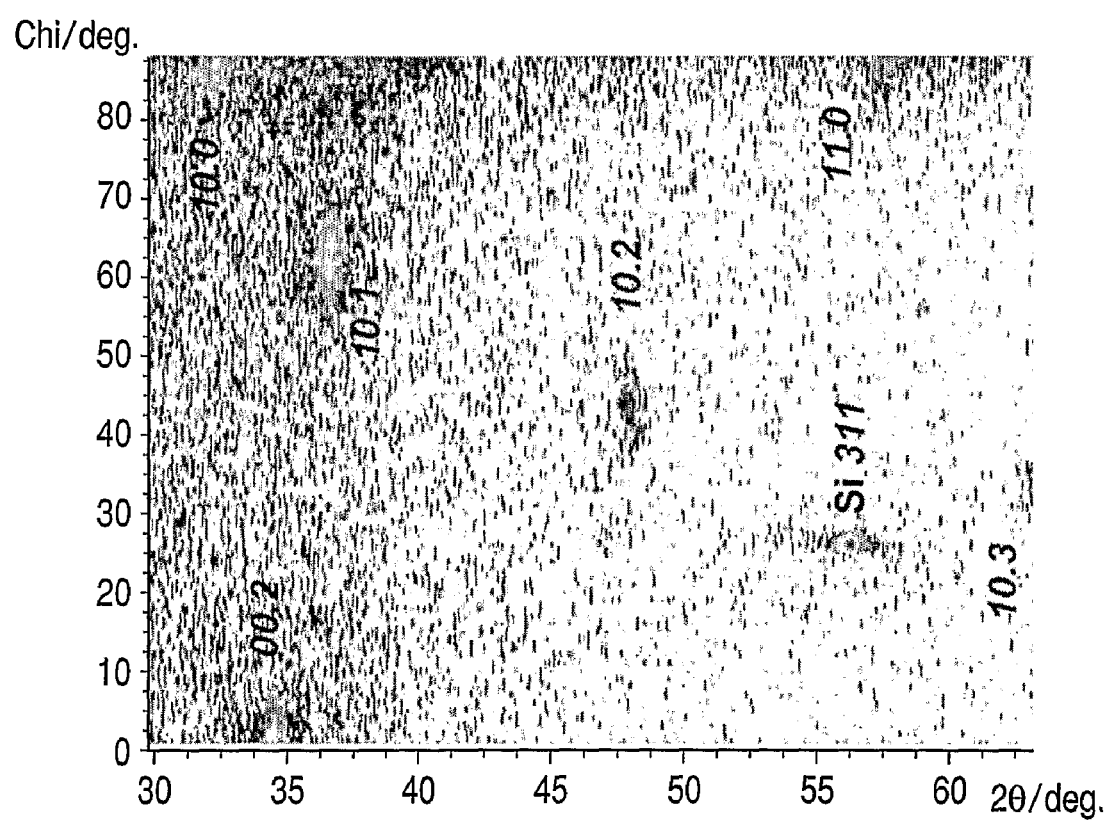
FIG. 24 illustrates a two-dimensional X-ray diffraction pattern of an oxynitride film produced in Example 11.

FIG. 21 illustrates conductivities in the case where the oxynitride semiconductor according to the present invention is irradiated with light at different wavelengths. When the light irradiation is performed, the conductivity is increased by up to approximately four orders of magnitude at greatest. Even when light irradiation in the visible region is performed, the conductivity increases. Therefore, it is found that the oxynitride semiconductor is sensitive to visible light. FIG. 22 is a graph illustrating an optical response characteristic to light having a wavelength of 500 nm Current can be switched on/off by the on/off control of light irradiation.

Therefore, the oxynitride semiconductor according to the present invention can be used for a light receiving layer of a light receiving device such as a sensor or a solar cell. In particular, it is found that the oxynitride semiconductor according to the present invention can be applied to a device which requires sensitivity to visible light.

EXAMPLES

Hereinafter, the present invention will be further described with reference to examples. The invention is not limited to the examples.

Example 1

Zn—In—ON Film, N/(N+O)=35 Atomic Percent

In this example, a Zn—In—ON film was formed on a glass and silicon substrates in an atmosphere containing a mixture of argon and nitrogen by RF sputtering using a radical source. A 2-inch sintered material having a composition of ZnO and a 2-inch sintered material having a composition of $In_2O_3$ (each of which has a purity of 99.9%) were used as targets (material sources). Input RF powers are 50 W (ZnO) and 30 W ($In_2O_3$). The radical source is excited by electron cyclotron resonance plasma. Input microwave power is 80 W. In this example, N radicals generated from the radical source are introduced into the sputtering film formation atmosphere to control the nitrogen concentration in the film. The distance between each of the targets and the substrate was set to approximately 10 cm. The substrate temperature during film formation was set to 25° C. The Zn—In—ON film was formed in the atmosphere containing the mixture of argon and nitrogen of $4\times10^{-1}$ Pa. The introduced nitrogen partial pressure was set to $2\times10^{-1}$ Pa.

The obtained oxynitride film was measured by a step meter. As a result, the film thickness was 400 nm Fluorescent X-ray analysis and Rutherford backscattering spectrometry (RBS) analysis were performed. As a result, it was found that the atomic composition ratio of Zn which is expressed by Zn/(Zn+In) was 65 atomic percent and the atomic composition ratio of nitrogen which is expressed by N/(N+O) was approximately 35 atomic percent.

Comparative Example 1

Zn—In—O Film

In this comparative example, a Zn—In—O film was formed on a glass substrate in an atmosphere containing a mixture of argon and oxygen by RF sputtering. The Zn—In—O film was formed in the atmosphere containing the mixture of argon and oxygen of $4\times10^{-1}$ Pa. The introduced oxygen partial pressure was set to $2\times10^{-3}$ Pa. Note that, in this example, radicals are not introduced from the radical source into the film formation atmosphere. Other film formation conditions were set as in the case of Example 1. The obtained oxide film was measured by a step meter. As a result, the film thickness was 400 nm Fluorescent X-ray analysis was performed. As a result, the atomic composition ratio of Zn which is expressed by Zn/(Zn+In) was 64 atomic percent. The amount of nitrogen contained in the film was evaluated by secondary ion mass spectrometry (SIMS). As a result, it was found that the amount of nitrogen was equal to or smaller than the detection limit.

Comparative Example 2

Zn—In—ON Film, N=5%

In this comparative example, a Zn—In—ON film was formed on a glass substrate in an atmosphere containing a mixture of argon, oxygen, and nitrogen by RF sputtering. The Zn—In—ON film was formed in the atmosphere containing the mixture of argon, oxygen, and nitrogen of $4\times10^{-1}$ Pa. The introduced oxygen partial pressure was set to $5\times10^{-3}$ Pa and the nitrogen partial pressure was set to $1\times10^{-3}$ Pa. Note that, in this example, radicals are not introduced from the radical source into the film formation atmosphere. Other film formation conditions were set as in the case of Example 1. The obtained oxynitride film was measured by a step meter. As a result, the film thickness was 400 nm. Fluorescent X-ray analysis was performed. As a result, the atomic composition ratio of Zn which is expressed by Zn/(Zn+In) was 61 atomic percent. The amount of nitrogen contained in the film was evaluated by secondary ion mass spectrometry (SIMS). As a result, it was found that the atomic composition ratio of nitrogen which is expressed by N/(N+O) was approximately 5 atomic percent.

Comparative Example 3

In—ON Film

In this comparative example, an In—ON film was formed on a glass substrate in an atmosphere containing a mixture of argon and nitrogen by RF sputtering using a radical source. The In—ON film was formed in the atmosphere containing the mixture of argon and nitrogen of $4\times10^{-1}$ Pa. The introduced nitrogen partial pressure was set to $2\times10^{-3}$ Pa. A 2-inch sintered material having a composition of $In_2O_3$ (purity is 99.9%) was used as a target. Input RF power is 30 W. Other film formation conditions were set as in the case of Example 1. The obtained oxynitride film was measured by a step meter. As a result, the film thickness was 400 nm RBS analysis was performed. As a result, it was found that the atomic composition ratio of nitrogen which is expressed by N/(N+O) was approximately 35 atomic percent.

(Film Characteristics)

Electrical characteristics of the oxynitride semiconductor obtained in this example were evaluated by hole measurement. As a result, the hole mobility value was found to be approximately 30 cm$^2$/Vs, which is approximately two times higher than the hole mobility of the semiconductor which is obtained in each of Comparative Examples 1 and 2. In contrast, it was found that the carrier concentration was approximately 10$^{18}$/cm$^3$, which is lower than the carrier concentration of the In—ON film in Comparative Example 3 by one or more orders of magnitude.

Next, optical absorption spectral analysis was performed. As a result, the band gap value of the oxynitride film produced in Example 1 was found to be approximately 1.4 eV. It has been found that the band gap of the oxide semiconductor in Comparative Example 1 is approximately 2.7 eV and the band gap of the oxynitride semiconductor in Comparative Example 2 is approximately 2.5 eV. When a large amount of nitrogen is introduced into the film, the photo sensitivity in the visible light region significantly increases. In contrast, it was found that, although the band gap of the In—ON film in Comparative Example 3 was a relatively small value of 1.8 eV, the band gap became increased to approximately 3 eV by annealing in the atmosphere at 300° C. This reason is not obvious. However, the reason may be as follows. The decomposition energy of In—N which is 0.2 eV is lower than the decomposition energy of In—O which is 2.2 eV, so nitrogen is released from the film by atmospheric annealing and oxygen in the atmosphere is incorporated in the film. It was found that a change in band gap of the Zn—In—On film in Example 1 was not observed even in the case of atmospheric annealing at 300° C. and thus the heat stability was excellent.

Conductivity values before and after the annealing were compared with each other. As a result, a change thereof was hardly observed. Therefore, it was found that the heat stability was excellent in terms of electrical characteristics.

The structure and composition of the oxynitride film produced in Example 1 were identified using a transmission electron microscope (TEM). FIGS. 8A to 8C illustrate a high-resolution TEM image of a cross section of the thin film (FIG. 8A) and fast Fourier transform (FFT) images of crystal lattice (FIGS. 8B and 8C). The high-resolution TEM image confirmed that microcrystals whose crystal grain diameters were comparable to the film thickness were formed over the entire film. The two FFT images were obtained from lattice fringes of crystal grains indicated by the square area on the high-resolution TEM image. They corresponded to FFT images having a hexagonal close-packed structure as viewed from [4100] and [−12-10] orientations, respectively. White spots on each of the FFT images indicate the crystal plane orientation and the plane interval. Lattice constants of the hexagonal close-packed structure were measured from the spots. As a result, the a-axis (=b-axis) length was approximately 0.34 nm and the c-axis length was approximately 0.54 nm. These results proved that the crystal structure of the oxynitride film according to the present invention was the hexagonal structure.

Figure 9A:
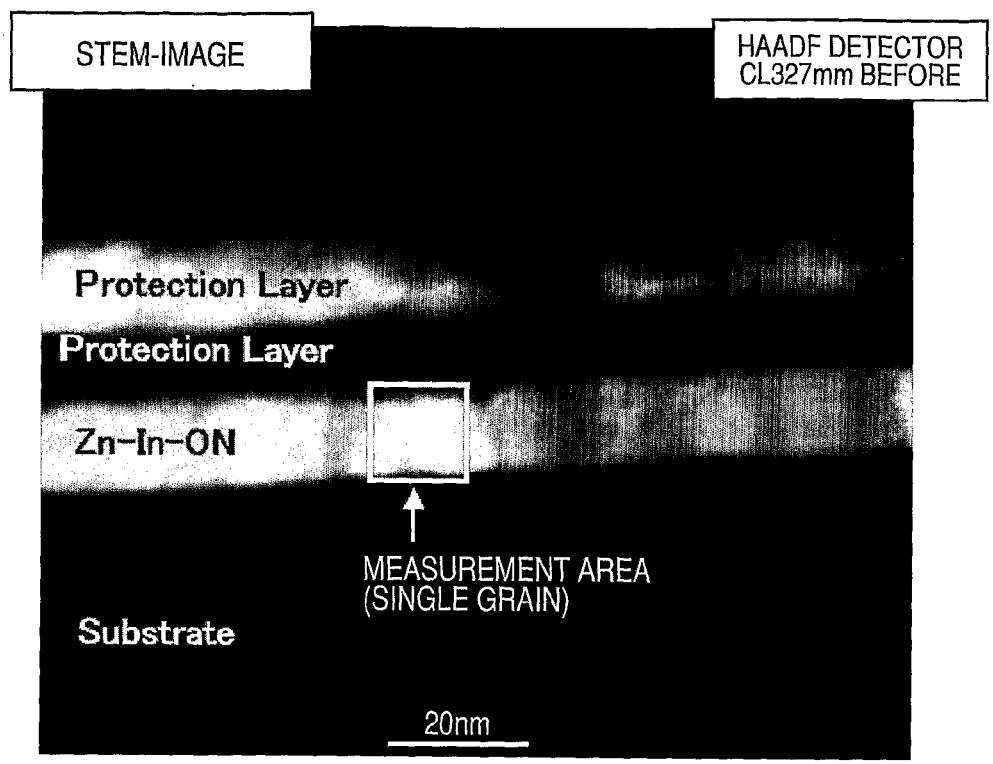
FIG. 9A is an STEM photograph and FIG. 9B is an electron energy loss spectroscopy (EELS) spectrum diagram, which illustrate the oxynitride film produced in Example 1 of the present invention.
Figure 9B:
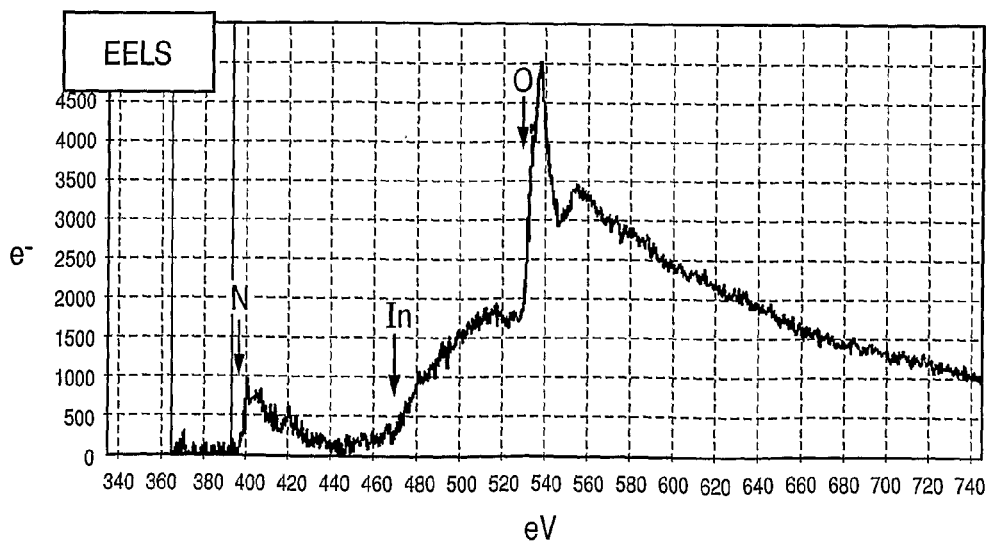

The composition of the crystal grains was analyzed by an electron energy loss spectroscopy (EELS) method using a scanning TEM (STEM) image observation. Use of the STEM image observation enables EELS measurement on an arbitrary crystal grain. The obtained EELS spectrum includes peaks peculiar to elements, so the composition within a measurement area can be analyzed. FIGS. 9A and 9B illustrate the STEM image of the thin film (FIG. 9A) and the EELS spectrum (FIG. 9B) obtained from the measurement area indicated by the square mark of FIG. 9A. In the EELS spectrum, the abscissa indicates energy loss amount of transmission electron and the ordinate indicates measured intensity. It was confirmed that the obtained EELS spectrum includes peaks of N, O, Zn (not shown because measurement energy range is different from others), and In.

The two results proved that, as illustrated in a schematic view of FIG. 10, the crystal grains included cation grains of Zn or In and anion grains of O or N, which formed the wurtzite structure.

Two-dimensional X-ray diffraction measurement was performed to evaluate an average crystal structure in a submillimeter region (approximately 1×0.1 mm). According to the X-ray diffraction, the diffraction pattern peculiar to the crystal structure was obtained. The diffraction pattern as illustrated in FIG. 11 was obtained from the thin film according to the present invention. Spots observed on the diffraction pattern correspond to crystal planes illustrated in FIG. 11. It was confirmed that the obtained diffraction pattern corresponded to the result obtained by simulation (FIG. 12) of ZnO having the same wurtzite structure as the crystal structure in the present invention, and thus the entire formed Zn—In—ON thin film had the wurtzite structure.

Figure 7:
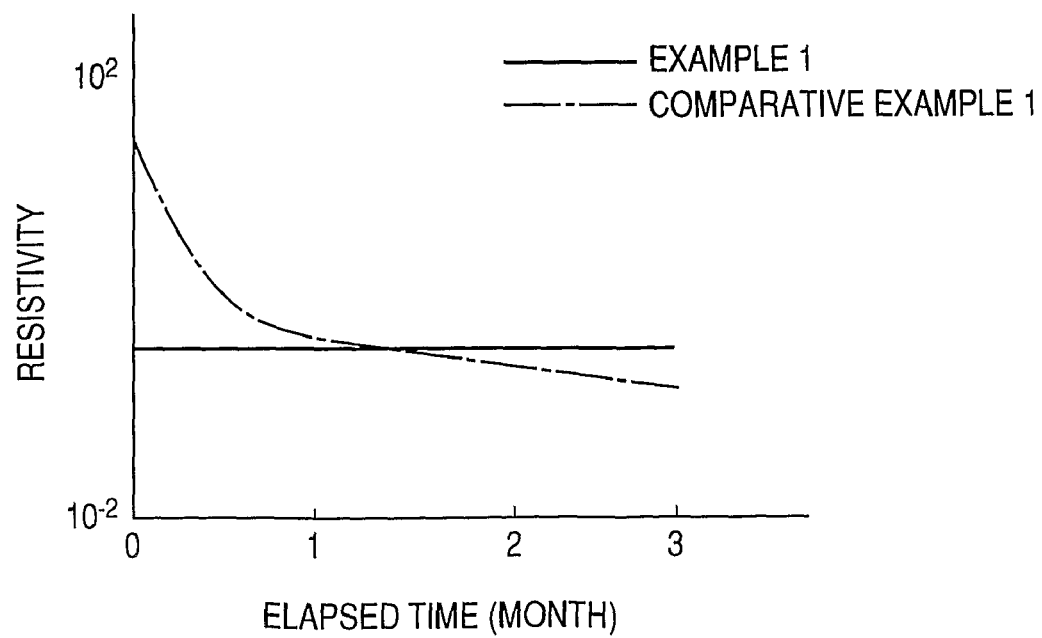
FIG. 7 is a graph illustrating a temporal change in resistivity in the case where an oxynitride film produced in Example 1 of the present invention is left in the atmosphere at a temperature of 20° C. and a humidity of 50%.

Next, in order to examine the temporal stability of the Zn—In—ON film, the oxynitride film produced in Example 1 and the oxide film produced in Comparative Example 1 were left in the atmosphere at a temperature of 20° C. and a humidity of 50% to measure the temporal change in resistivity. FIG. 7 illustrates the result thereof. A reduction of approximately three orders of magnitude in resistivity was observed after the oxide film produced in Comparative Example 1 was left at rest for three months. On the other hand, it was found that a change in resistivity of the oxynitride film produced in Example 1 was not observed, and thus the environmental stability thereof was excellent.

As described above, the oxynitride semiconductor film whose nitrogen concentration is relatively high is formed. Therefore, the semiconductor having both high mobility and environmental stability can be realized. The oxynitride semiconductor has high photo sensitivity in the visible light region. Therefore, it was found that the oxynitride semiconductor could be applied to not only the active layer of a high-speed transistor or diode but also, for example, a light absorption layer of a high-efficiency solar cell.

When the oxynitride semiconductor film whose Zn concentration is high is formed, the carrier concentration in the film can be reduced. Therefore, when the oxynitride semiconductor film is used as the active layer of the semiconductor device, for example, an effect of reducing the off-current of the TFT can be anticipated.

Example 2

Zn—In—ON Film, N/(N+O)=42 Atomic Percent, Zn/(Zn+In =85 Atomic Percent

In this example, a Zn—In—ON film was formed on a glass substrate in an atmosphere containing a mixture of argon and nitrogen by RF sputtering using a radical source.

A 2-inch sintered material having a composition of ZnO and a 2-inch sintered material having a composition of In$_2$O$_3$ (each of which has a purity of 99.9%) were used as targets (material sources). Input RF powers are 65 W (ZnO) and 12 W (In$_2$O$_3$). The radical source is excited by electron cyclotron resonance plasma. Input microwave power is 150 W. In this example, N radicals generated from the radical source are introduced into the sputtering film formation atmosphere to control nitrogen concentration in the film. The distance between each of the targets and the substrate was set to approximately 10 cm. The substrate temperature during film formation was set to 25° C. The Zn—In—ON film was formed in the atmosphere containing the mixture of argon and nitrogen of $4\times10^{-1}$ Pa. The introduced nitrogen partial pressure was set to $3.2\times10^{-1}$ Pa.

The obtained oxynitride film was measured by a step meter. As a result, the film thickness was 400 nm Fluorescent X-ray analysis and Rutherford backscattering spectrometry (RBS) analysis were performed. As a result, it was found that the atomic composition ratio of Zn which is expressed by Zn/(Zn+In) was 85 atomic percent and the atomic composition ratio of nitrogen which is expressed by N/(N+O) was approximately 42 atomic percent.

(Film Characteristics)

Electrical characteristics of the oxynitride semiconductor obtained in this example were evaluated by hole measurement. It is expected that the hole mobility value is equal to or smaller than the measurement limit and the carrier concentration is lower than in Example 1 by one or more orders of magnitude.

Optical absorption spectral analysis was performed. As a result, the band gap value of the oxynitride film produced in Example 2 was approximately 1.3 eV. As in Example 1, it was found that a change in optical absorption spectrum was not observed in the case of atmospheric annealing at 300° C. and thus the heat stability was excellent.

Next, in order to examine the temporal stability of the Zn—In—ON film, the oxynitride film produced in this example was left in the atmosphere at a temperature of 20° C. and a humidity of 50%, and the temporal change in resistivity was measured. As a result, it was found that a change in resistivity of the oxynitride film produced in this example was not observed, and thus the environmental stability thereof was found to be excellent.

As described above, the band gap and the carrier concentration of the oxynitride semiconductor film can be controlled by adjusting the concentration of nitrogen contained therein. In particular, there is a large effect of reducing the carrier concentration. When the oxynitride semiconductor film is used as the active layer of the semiconductor device, for example, an effect of reducing the off-current of the TFT can be anticipated.

Example 3

Transistor using Zn—In—ON for Active Layer

In this example, the top-gate Zn—In—ON thin film transistor as illustrated in FIG. 5 was manufactured.

A Zn—In—ON oxynitride film used as the active layer 12 was deposited on the glass substrate 11 in an atmosphere containing a mixture of argon and nitrogen by RF sputtering using a radical source. A 2-inch sintered material having a composition of ZnO and a 2-inch sintered material having a composition of $In_2O_3$ (each of which has a purity of 99.9%) were used as targets (material sources). Input RF powers are 50 W (ZnO) and 30 W ($In_2O_3$). The radical source is excited by electron cyclotron resonance plasma. Input microwave power is 80 W. In this example, N radicals generated from the radical source are introduced into the sputtering film formation atmosphere to control the nitrogen concentration in the film. The distance between each of the targets and the substrate was set to approximately 10 cm. The substrate temperature during film formation was set to 25° C. The Zn—In—ON film was formed in the atmosphere containing the mixture of argon and nitrogen of $4\times10^{-1}$ Pa. The introduced nitrogen partial pressure was set to $2\times10^{-1}$ Pa.

After that, a Ti layer whose thickness is approximately 5 nm and an Au layer whose thickness is approximately 100 nm were laminated in the stated order from the side close to the channel layer of the oxynitride semiconductor by an electron beam heating deposition method. Then, the adhesion layer 16 for improving adhesion, the source electrode 12, and the drain electrode 13 were formed by a photolithography method and a lift-off method. An $SiO_2$ film serving as the gate insulating film 14 was formed up to a film thickness of approximately 100 nm by a RF sputtering method. A Ti layer whose thickness is approximately 5 nm and an Au layer whose thickness is approximately 100 nm were laminated on the $SiO_2$ film in the stated order. Then, the gate electrode 15 was formed by a photolithography method and a lift-off method. The channel length was 10 μm and the channel width was 150 μm.

The TFT manufactured by the method described above was heated in the atmosphere at 300° C. for one hour. The resultant Zn—In—ON film was subjected to four-probe measurement. As a result, it was found that the resistivity was approximately 0.3 Ωcm. The oxynitride film was measured by a step meter. As a result, the film thickness was 13 nm Fluorescent X-ray analysis and Rutherford backscattering spectrometry (RBS) analysis were performed. As a result, it was found that the atomic composition ratio of Zn which is expressed by Zn/(Zn+In) was 65 atomic percent and the atomic composition ratio of nitrogen which is expressed by N/(N+O) was approximately 35 atomic percent.

(Characteristic Evaluation of TFT Device)

FIG. 6 illustrates the Id-Vg characteristic (transfer characteristic) at Vd=6 V in the case where the TFT device manufactured in this embodiment is measured at room temperature. It was found that an on-current was relatively large and thus the current Id of approximately $8\times10^{-4}$ A flowed at Vg=4V. The field effect mobility was calculated from the output characteristic. As a result, a field effect mobility of approximately 5 $cm^2/Vs$ was obtained in the saturation region. The current on/off ratio exceeded approximately $10^6$. The S-value was approximately 1.5 V/dec.

Next, in order to examine the temporal stability of the TFT manufactured in this example, the TFT was left at rest in the atmosphere at a temperature of 20° C., and a humidity of 50% to measure the temporal changes in TFT characteristics. As a result, the changes in TFT characteristics were not observed even after the TFT was left for half a year and thus the environmental stability thereof was found to be excellent.

As described above, the Zn concentration of the film and the thickness thereof were suitably selected. Thus, it was confirmed that the TFT operation was conducted even when the oxynitride semiconductor film with high nitrogen concentration was used as the active layer. When the oxynitride semiconductor film was used as the active layer of the TFT, it was possible to realize a TFT having excellent characteristics such as a field effect mobility of approximately 5 $cm^2/Vs$ and a current on/off ratio of approximately $10^6$.

Example 4

Zn—In—ON Film, N/(N+O)=55 Atomic Percent, Zn/(Zn+In)=40 Atomic Percent

In this example, a Zn—In—ON film is formed on a glass substrate in an atmosphere containing a mixture of argon and nitrogen by RF sputtering.

A 2-inch sintered material having a composition of ZnO (purity of 99.9%) and a 2-inch sintered material having a composition of In (purity of 99.9%) are used as targets (material sources). Input RF powers are 50 W (ZnO) and 15 W (In).

The distance between each of the targets and the substrate was set to approximately 10 cm. The substrate temperature during film formation was set to 25° C. The Zn—In—ON film is formed in the atmosphere containing the mixture of argon and nitrogen of $4\times10^{-1}$ Pa. The introduced nitrogen partial pressure is set to $3.2\times10^{-1}$ Pa.

The obtained oxynitride film was measured by a step meter. As a result, the film thickness is 400 nm. Fluorescent X-ray analysis, X-ray photoelectron spectroscopy and Rutherford backscattering spectrometry (RBS) analysis were performed. As a result, it is found that the atomic composition ratio of Zn which is expressed by Zn/(Zn+In) is 40 atomic percent and the atomic composition ratio of nitrogen which is expressed by N/(N+O) is approximately 55 atomic percent.

(Film Characteristics)

Electrical characteristics of the oxynitride semiconductor obtained in this example were evaluated by hole measurement. As a result, the hole mobility is approximately 40 $cm^2/Vs$ and the carrier concentration is approximately $5\times10^{18}/cm^3$.

Optical absorption spectral analysis was performed. As a result, the band gap of the oxynitride film produced in this example was approximately 1.2 eV. As in Example 1, a change in optical absorption spectrum was not observed in the case of atmospheric annealing at 300° C. and thus the heat stability was found to be excellent.

Next, in order to examine the temporal stability of the Zn—In—ON film, the oxynitride film produced in this example was left at rest in the atmosphere at a temperature of 20° C. and a humidity of 50%, and the temporal change in resistivity was measured. As a result, the change in resistivity of the oxynitride film produced in this example was not observed and thus the environmental stability thereof was found to be excellent.

As described above, the band gap and the carrier mobility of the oxynitride semiconductor film can be controlled by adjusting the concentration of nitrogen contained therein and the metal composition ratio thereof.

Example 5

Zn—Ga—ON Film, Zn/(Zn+Ga): 17 Atomic Percent to 87 Atomic Percent

In this example, a Zn—Ga—ON film was formed on a silicon substrate with a thermally oxidized film (300 nm) in an atmosphere containing a mixture of argon and nitrogen by RF sputtering.

In this example, in order to examine the dependency of the film on the atomic composition ratio, a combinatorial method was used for film formation. That is, the dependency was examined using a method of simultaneously forming oxynitride thin films having various compositions on a single substrate by sputtering. Note that this method is not necessarily used. A material source (target) having a predetermined composition may be prepared to form an oxynitride thin film or input power for respective multiple targets may be controlled to form a thin film having a desirable composition.

The Zn—Ga—ON film was formed using a co-sputtering apparatus with diagonal incidence configuration. Targets are located in a diagonal direction relative to the substrate, so the composition of the film varies depending on differences in distances from the targets. Therefore, a thin film having a wide composition distribution could be obtained over the surface of the substrate.

A 2-inch sintered material having a composition of ZnO, and a 2-inch sintered material having a composition of GaN (each of which has a purity of 99.9%) were used as the targets (material sources). Input RF powers are 50 W (ZnO), and 70 W (GaN). The distance between each of the targets and the substrate was set to approximately 7 cm to 12 cm. The substrate temperature during film formation was set to 25° C. The Zn—Ga—ON film was formed in an atmosphere containing a mixture gas of argon and nitrogen of $4\times10^{-1}$ Pa. The introduced nitrogen partial pressure was set to $3.2\times10^{-1}$ Pa.

The obtained oxynitride film was measured by a step meter. As a result, the film thickness was 400 nm Fluorescent X-ray analysis was performed. As a result, it was found that the atomic composition ratio of Zn which is expressed by Zn/(Zn+Ga) was 17 atomic percent to 87 atomic percent. Fluorescent X-ray analysis and Rutherford backscattering spectrometry (RBS) analysis were performed. As a result, it was found that the atomic composition ratio of Zn which is expressed by Zn/(Zn+Ga) was approximately 53 atomic percent at the center of the substrate, the atomic composition ratio of nitrogen which is expressed by N/(N+O) was approximately 50 atomic percent at the center of the substrate, and the atomic composition ratio of metal which is expressed by (Zn+Ga)/(Zn+Ga+N+O) was approximately 48 atomic percent at the center of the substrate.

X-ray diffraction measurement was performed. As a result, it was confirmed that a diffraction peak was detected around $2\theta=34°$, over the entire composition, and the formed film was crystallized.

Comparative Example 4

Zn—Ga—O Film

In this comparative example, a Zn—Ga—O film is formed on a silicon substrate with a thermally oxidized film (300 nm) in an atmosphere containing a mixture of argon and oxygen by RF sputtering. The Zn—Ga—O film was formed in an atmosphere containing a mixture of argon and oxygen of $4\times10^{-1}$ Pa. The introduced oxygen partial pressure was set to $2\times10^{-3}$ Pa. A 2-inch sintered material having a composition of ZnO and a 2-inch sintered material having a composition of $Ga_2O_3$ (each of which has a purity of 99.9%) were used as targets (material sources). Other film formation conditions are set as in the case of Example 5. The film thickness of the oxide film which is obtained by measurement using a step meter is 400 nm Fluorescent X-ray analysis is performed. As a result, the atomic composition ratio of Zn which is expressed by Zn/(Zn+Ga) is 17 atomic percent to 87 atomic percent and the atomic composition ratio of Zn at the center of substrate is approximately 50 atomic percent. The amount of nitrogen contained in the film was equal to or smaller than the detection limit of secondary ion mass spectrometry (SIMS).

(Film Characteristics)

Electrical characteristics of the oxynitride semiconductor film obtained in Example 5 were evaluated by hole measurement. As a result, the electrical characteristic values are equal to or smaller than the measurement limits, so a low carrier concentration can be obtained.

Optical absorption spectral analysis was performed. As a result, the band gap of the oxynitride film produced in Example 5 was approximately 1.8 eV to 2.5 eV. The band gap of the oxide semiconductor film obtained in Comparative Example 4 is approximately 3.0 eV to 4.4 eV. Therefore, the introduction of a large amount of nitrogen into the film caused a significant increase in photo sensitivity in the visible region. A change in band gap of the Zn—Ga—ON film according to Example 5 was not observed even in the case of atmospheric annealing at 300° C. and thus the heat stability was found to be excellent.

Resistivity was measured before and after the annealing. As a result, the resistivity value was 400 kΩ·cm to a value equal to or larger than the measurement limit (measurement limit approximately 10 mΩ·cm), which depends on the composition. When compared at the same metal composition ratio, a change in resistivity was hardly observed and thus the heat stability was found to be excellent in terms of electrical characteristics.

The structure and composition of the oxynitride film produced in Example 5 were identified using a transmission electron microscope (TEM). Note that the composition of the observed oxynitride film is obtained by fluorescent X-ray analysis and Rutherford backscattering spectrometry (RBS) analysis. It was found that the atomic composition ratio of Zn which is expressed by Zn/(Zn+Ga) was approximately 53 atomic percent, the atomic composition ratio of nitrogen which is expressed by N/(N+O) was approximately 50 atomic percent, and the atomic composition ratio of metal which is expressed by (Zn+Ga)/(Zn+Ga+N+O) was approximately 48 atomic percent.

The thin cross-section was observed with a high-resolution TEM. As a result, it was confirmed that microcrystals whose crystal grain diameters are approximately several 10 nm to 150 nm were formed over the entire film.

Figure 13:
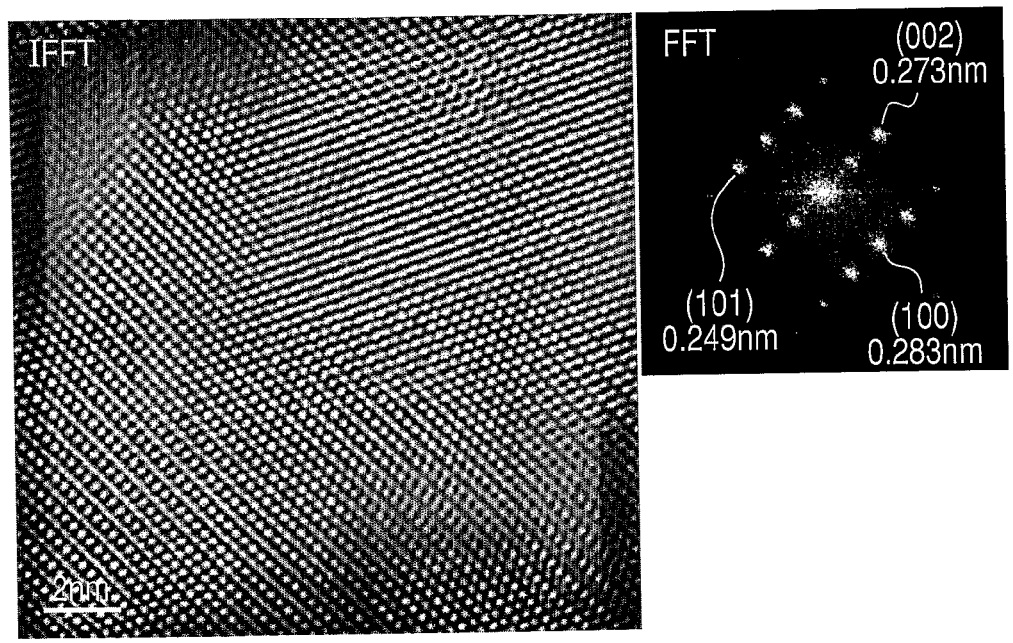
FIG. 13 illustrates an inverse fast Fourier transform (IFFT) image of an oxynitride film produced in Example 5 and a fast Fourier transform (FFT) pattern of the crystal lattice fringe thereof.
Figure 14:
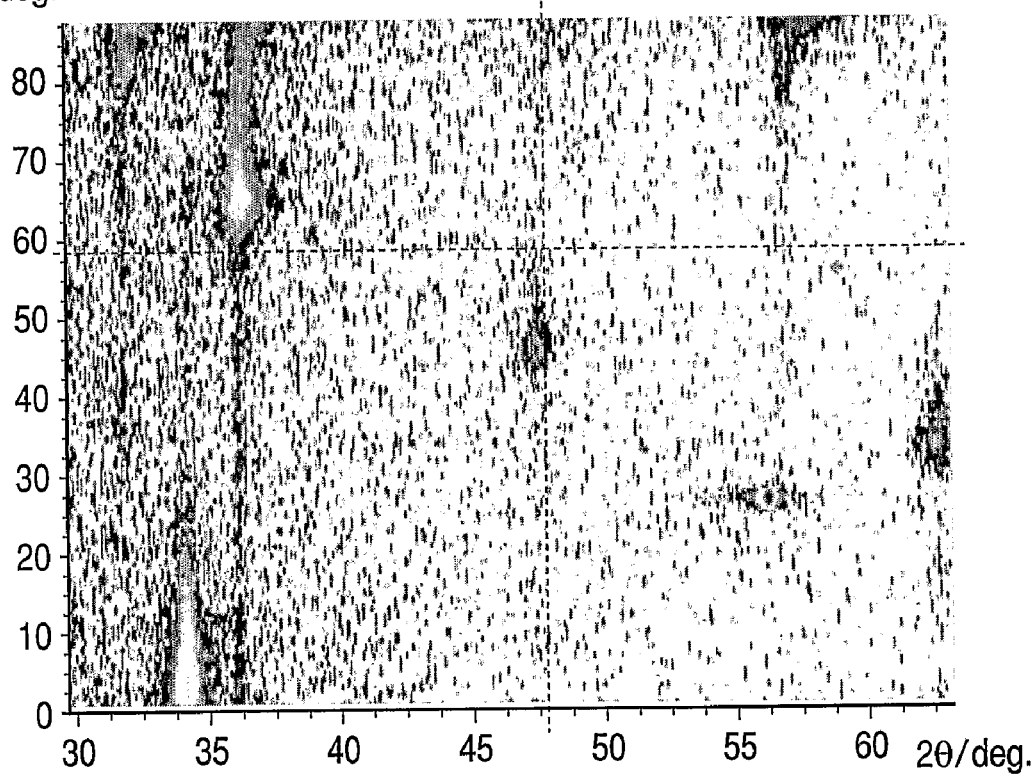
FIG. 14 illustrates a two-dimensional X-ray diffraction pattern of the oxynitride film produced in Example 5.

FIG. 13 illustrates an inverse fast Fourier transform (IFFT) image of the oxynitride film and a fast Fourier transform (FFT) pattern of the crystal lattice fringe thereof, which are obtained using a high-resolution transmission electron microscope. The crystal structure and lattice constants thereof were evaluated from the FFT pattern. As a result, an FFT pattern corresponding to the hexagonal close-packed structure was obtained. With respect to the lattice constants, the a-axis (=b-axis) length was approximately 0.34 nm and the c-axis length was approximately 0.54 nm. The result proved that the crystal structure of the oxynitride film according to the present invention was the hexagonal structure and the lattice constants thereof were larger compared with the case of ZnO or GaN. The composition of the microcrystals is analyzed by an electron energy loss spectroscopy (EELS) method. As a result, it is found that the microcrystals include cations of Zn or In and anions of O or N, which form the wurtzite structure.

The thin film produced in Example 5 was subjected to two-dimensional X-ray diffraction measurement. As a result, it was confirmed that, although the different lattice constants were obtained, the same pattern (see FIG. 14) as in the result obtained by simulation (FIG. 12) of ZnO having the wurtzite structure was observed and thus the entire thin film was formed by the Zn—Ga—ON film having the wurtzite structure. The lattice constants were derived from the result obtained by the X-ray diffraction measurement. As a result, the c-axis length maintained a substantially constant value of approximately 0.54 nm at different composition ratios. Therefore, the result proved that the lattice constants were larger compared with the case of each of ZnO and GaN.

Next, in order to examine the temporal stability of the Zn—Ga—ON film, the oxynitride film produced in Example 5 was left at rest in the atmosphere at a temperature of 20° C. and a humidity of 50%, and the temporal change in resistivity was measured. As a result, the change in resistivity was not observed and thus the environmental stability was found to be excellent.

As described above, when the oxynitride semiconductor containing Ga and Zn was formed, it was found that a semiconductor whose residual carrier concentration is low and whose band gap can be adjusted in the visible region could be realized at room temperature, and thus the semiconductor could be applied to, for example, a light absorption layer of a high-efficiency solar cell.

Example 6

Transistor Using Zn—Ga—On for Active Layer

Figure 15:
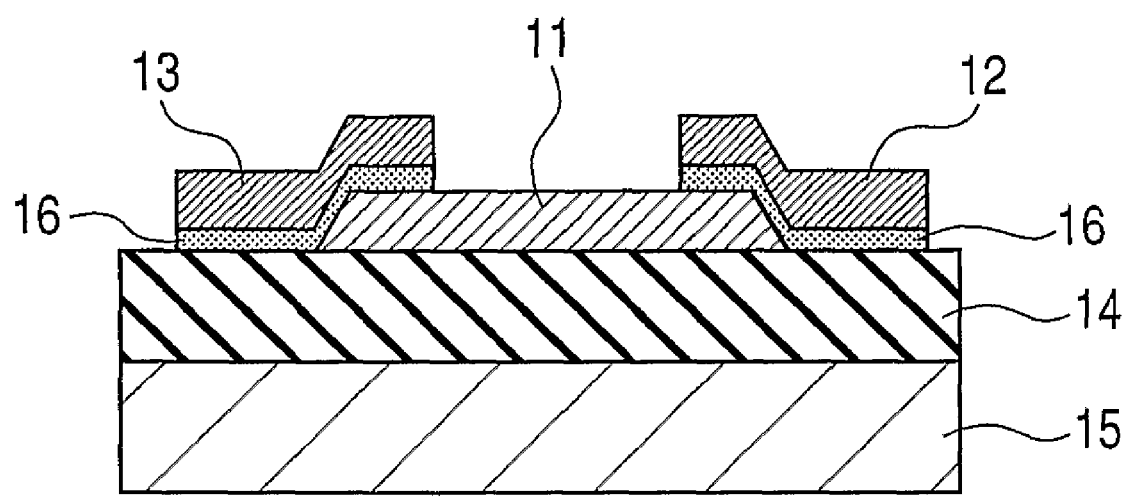
FIG. 15 is a schematic cross-sectional view illustrating a structural example of the thin film transistor according to the embodiment of the present invention.

In this example, a bottom-gate Zn—Ga—ON thin film transistor illustrated in FIG. 15 was manufactured.

In this example, in order to examine the dependency of the active layer on the atomic composition ratio, a combinatorial method was used for film formation. That is, the dependency was examined using a method of simultaneously forming oxynitride thin films having various compositions on a single substrate by sputtering. Note that the method is not necessarily used. A material source (target) having a predetermined composition may be prepared to form an oxynitride thin film or input power for respective multiple targets may be controlled to form a thin film having a desirable composition.

A Zn—Ga—ON oxynitride film used as an active layer 12 was deposited on a silicon substrate with a thermally oxidized film in an atmosphere containing a mixture gas of argon and nitrogen by RF sputtering. In this example, the thermally oxidized film serves as a gate insulating film 14 and the silicon substrate serves as a gate electrode 11. The film thickness of the thermally oxidized film is 100 nm A 2-inch sintered material having a composition of ZnO, and a 2-inch sintered material having a composition of GaN (each of which has a purity of 99.9%) were used as targets (material sources). Input RF powers are 50 W (ZnO) and 70 W (GaN). The distance between each of the targets and the substrate was set to approximately 7 cm to 12 cm. The substrate temperature during film formation was set to 25° C. The Zn—Ga—ON film was formed in the atmosphere containing the mixture gas of argon and nitrogen of $4\times10^{-1}$ Pa. The introduced nitrogen partial pressure was set to $3.2\times10^{-1}$ Pa.

After that, a Ti layer whose thickness was approximately 5 nm and an Au layer whose thickness was approximately 100 nm were laminated in the stated order from the side close to the channel layer of the oxynitride semiconductor by an electron beam heating deposition method. Then, an adhesion layer 16 for improving adhesion, a source electrode 12, and a drain electrode 13 were formed. The channel length was 10 μm and the channel width was 150 μm.

The TFT manufactured by the method described above was heated in the atmosphere at 300° C. for one hour. The resultant Zn—Ga—ON film was subjected to four-probe measurement. As a result, it was found that the resistivity was equal to or larger than 100 kΩcm. The obtained oxynitride film was measured by a step meter. As a result, the film thickness was approximately 20 nm. Fluorescent X-ray analysis was performed. As a result, it was found that the atomic composition ratio of Zn which is expressed by Zn/(Zn+Ga) was 30 atomic percent to 80 atomic percent. Then, fluorescent X-ray analysis and Rutherford backscattering spectrometry (RBS) analysis were performed. As a result, it was found that the atomic composition ratio of Zn which is expressed by Zn/(Zn+Ga) was approximately 53 atomic percent at the center of the substrate. Similarly, it was found that the atomic composition ratio of nitrogen which is expressed by N/(N+O) was approximately 50 atomic percent at the center of the substrate, and the atomic composition ratio of metal which is expressed by (Zn+Ga)/(Zn+Ga+N+O) was approximately 48 atomic percent at the center of the substrate.

(Characteristic Evaluation of TFT Device)

Figure 16:
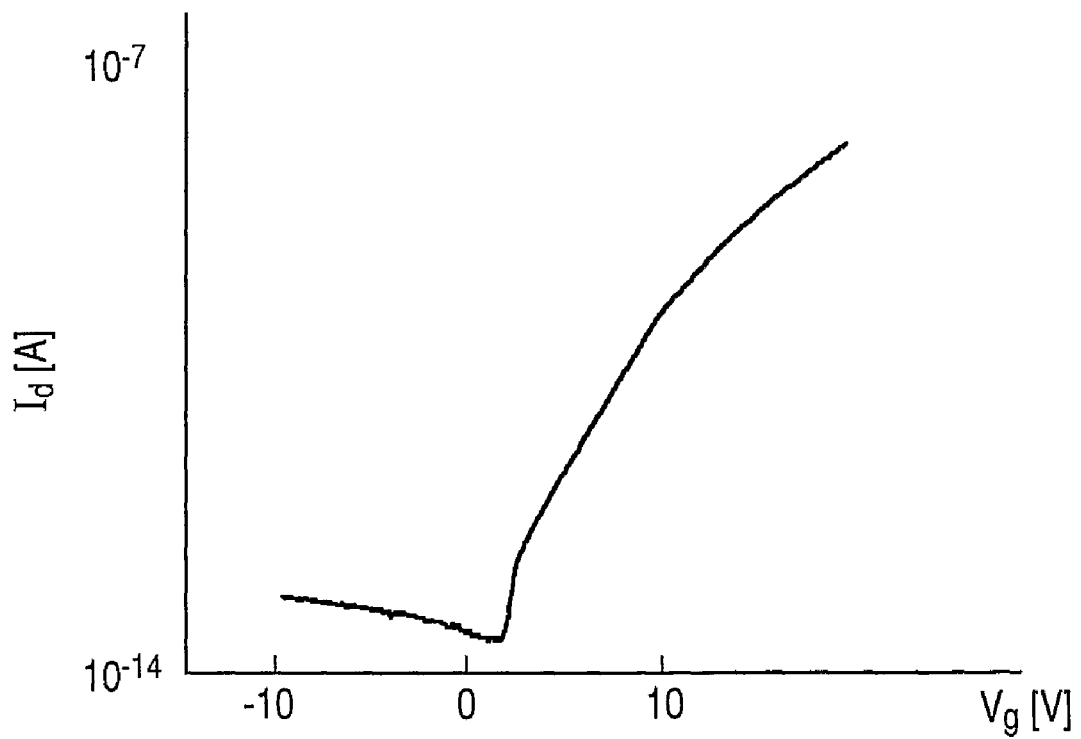
FIG. 16 is a graph illustrating a typical TFT characteristic of a thin film transistor manufactured in Example 6.

Excellent transistor characteristics were obtained in a composition range in which the atomic composition ratio of Zn which is expressed by Zn/(Zn+Ga) is 35 atomic percent to 80 atomic percent, and the current on/off ratio was equal to or larger than $10^3$ in this range. FIG. 16 illustrates an example of the Id-Vg characteristic (transfer characteristic) at Vd=6 V in the case where the TFT device manufactured in this example is measured at room temperature. According to the result obtained by fluorescent X-ray analysis and Rutherford backscattering spectrometry (RBS) analysis, it has been found that the atomic composition ratio of Zn which is expressed by Zn/(Zn+Ga) is approximately 75 atomic percent and the atomic composition ratio of nitrogen which is expressed by N/(N+O) is approximately 30 atomic percent. It was found that a current Id of approximately $8 \times 10^{-8}$ A flowed at Vg=20 V and the current on/off ratio exceeded $10^5$. In this example, a so-called normally-off characteristic in which the current does not flow when the gate voltage is 0 V could be realized. This reason may be that a low residual carrier concentration could be obtained by Ga used as a constituent element.

Next, in order to examine the temporal stability of the TFT manufactured in this example, the TFT was left at rest in the atmosphere at a temperature of 20° C. and a humidity of 50% to measure the temporal changes in TFT characteristics. As a result, the changes in TFT characteristics were not observed even after the TFT was left at rest for half a year and thus the environmental stability thereof was found to be excellent.

As described above, when the concentration of Zn contained in the film and the thickness thereof were suitably selected, it was confirmed that the TFT operation was conducted even when the oxynitride semiconductor film with high nitrogen content in the film was used as the active layer. When the oxynitride semiconductor film was used as the active layer of the TFT, it was possible to realize a normally-off TFT having an excellent characteristic such as a current on/off ratio of approximately $10^6$.

Example 7

In—Zn—Ga—ON Film, Zn/(In+Zn+Ga): 88 Atomic Percent to 18 Atomic Percent

In this example, an In—Zn—Ga—ON film was formed on a silicon substrate with a thermally oxidized film (300 nm) in an atmosphere containing a mixture of argon and nitrogen by RF sputtering.

In this example, in order to examine the dependency of the film on the atomic composition ratio, a combinatorial method was used for film formation. That is, the dependency was examined using a method of simultaneously forming oxynitride thin films having various compositions on a single substrate by sputtering. Note that the method is not necessarily used. A material source (target) having a predetermined composition may be prepared to form an oxynitride thin film or input power for respective multiple targets may be controlled to form a thin film having a desirable composition.

The In—Zn—Ga—ON film was formed using a co-sputtering apparatus with diagonal incidence configuration. Targets are located in a diagonal direction relative to the substrate, so the composition of the film varies depending on differences in distances from the targets. Therefore, a thin film having a wide composition distribution can be obtained over the surface of the substrate.

A 2-inch sintered material having a composition of $In_2O_3$, a 2-inch sintered material having a composition of ZnO, and a 2-inch sintered material having a composition of GaN (each of which has a purity of 99.9%) were used as the targets (material sources). Input RF powers are 30 W ($In_2O_3$), 50 W (ZnO), and 60 W (GaN). The distance between each of the targets and the substrate was set to approximately 7 cm to 12 cm. The substrate temperature during film formation was set to 25° C. The In—Zn—Ga—ON film was formed in an atmosphere containing a mixture gas of argon and nitrogen of $4 \times 10^{-1}$ Pa. The introduced nitrogen partial pressure was set to $3.2 \times 10^{-1}$ Pa.

Figure 17:
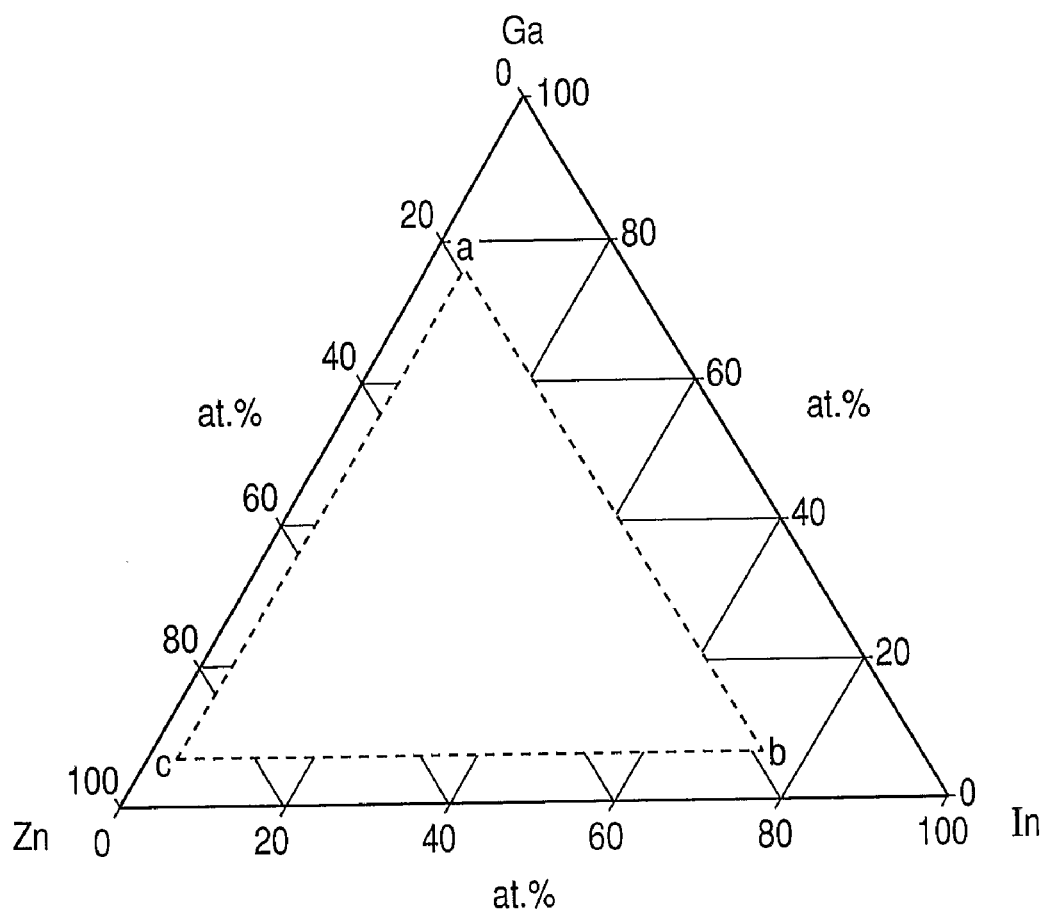
FIG. 17 is a ternary phase diagram illustrating a metal composition range of a film obtained in Example 7.
Figure 18:
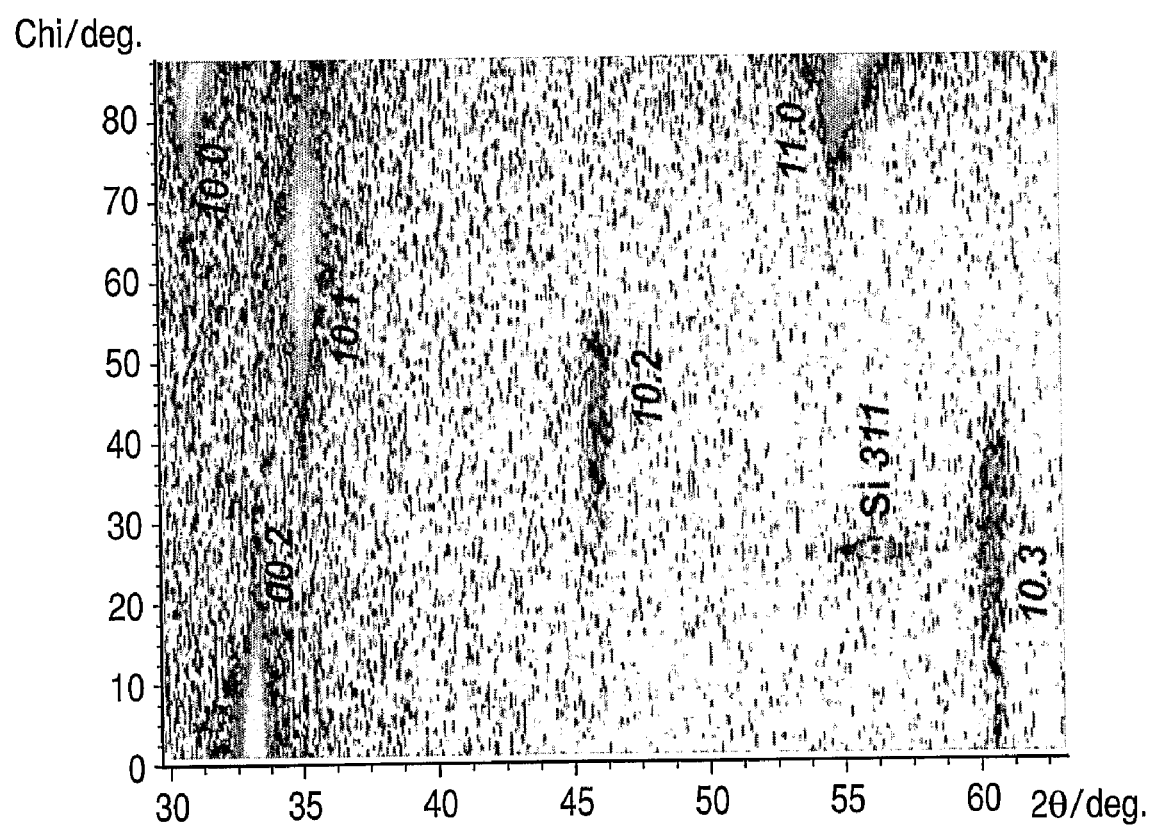
FIG. 18 illustrates a two-dimensional X-ray diffraction pattern of an oxynitride film produced in Example 7.

The obtained oxynitride film was measured by a step meter. As a result, the film thickness was 400 nm Fluorescent X-ray analysis was performed. As a result, it was found that the atomic composition ratio of In which is expressed by In/(In+Zn+Ga) was 2 atomic percent to 60 atomic percent, the atomic composition ratio of Zn which is expressed by Zn/(In+Zn+Ga) was 18 atomic percent to 88 atomic percent. Similarly, it was found that the atomic composition ratio of Ga which is expressed by Ga/(In+Zn+Ga) was 8 atomic percent to 67 atomic percent. FIG. 17 is a ternary phase diagram illustrating the metal composition range of the film obtained in this example (region surrounded by the lines connecting points "a", "b", and "c" in FIG. 17). Fluorescent X-ray analysis and Rutherford backscattering spectrometry (RBS) analysis were performed. As a result, it was found that the atomic composition ratios of In, Zn, and Ga to the total number of metal atoms at the center of the substrate were approximately 18 atomic percent, approximately 55 atomic percent, and approximately 27 atomic percent, respectively. In addition, it was found that the atomic composition ratio of nitrogen which is expressed by N/(N+O) was approximately 40 atomic percent and the atomic composition ratio of metal which is expressed by (In+Zn+Ga)/(In+Zn+Ga+N+O) was approximately 49 atomic percent.

X-ray diffraction measurement was performed. As a result, it was confirmed that a diffraction peak was detected around $2\theta=31°$ to $34°$, which depends on composition ratio, and the formed film was crystallized.

Comparative Example 5

In—Zn—Ga—O Film

In this comparative example, an In—Zn—Ga—O film was formed on a silicon substrate with a thermally oxidized film (300 nm) in an atmosphere containing a mixture of argon and oxygen by RF sputtering. The In—Zn—Ga—O film was formed in the atmosphere containing the mixture gas of argon and oxygen of $4 \times 10^{-1}$ Pa. The introduced oxygen partial pressure was set to $4 \times 10^{-3}$ Pa. A 2-inch sintered material having a composition of $In_2O_3$, a 2-inch sintered material having a composition of ZnO, and a 2-inch sintered material having a composition of $Ga_2O_3$ (each of which has a purity of 99.9%) were used as targets (material sources). The other film formation conditions were set as in the case of Example 7. The obtained oxide film was measured by a step meter. As a result, the film thickness was 400 nm Fluorescent X-ray analysis was performed. As a result, it was found that the atomic composition ratio of In which is expressed by In/(In+Zn+Ga) was 10 atomic percent to 70 atomic percent, the atomic composition ratio of Zn which is expressed by Zn/(In+Zn+Ga) was 10 atomic percent to 80 atomic percent. Similarly, it was found that the atomic composition ratio of Ga which is expressed by Ga/(In+Zn+Ga) was 10 atomic percent to 70 atomic percent. In addition, it was found that the atomic composition ratios of In, Zn, and Ga to the total number of metal atoms at the center of the substrate were approximately 20 atomic percent, approximately 50 atomic percent, and approximately 30 atomic percent, respectively. The amount of nitrogen contained in the film was evaluated by secondary ion mass spectrometry (SIMS). As a result, it was found that the amount of nitrogen was equal to or smaller than the detection limit.

(Film Characteristics)

Electrical characteristics of the oxynitride semiconductor obtained in Example 7 were evaluated by hole measurement. As a result, in a region in which the ratio of the number of In atoms to the total number of metal atoms is equal to or larger than 50 atomic percent, the hole mobility was approximately 20 $cm^2$/Vs to 25 $cm^2$/Vs and the carrier concentration is approximately $10^{17}/cm^3$ to $10^{18}/cm^3$. In a composition region other than the above-mentioned region, the hole mobility and the carrier concentration were equal to or smaller than the measurement limits. Therefore, a low carrier concentration could be obtained.

Optical absorption spectral analysis was performed. As a result, the band gap of the oxynitride film produced in Example 7 was approximately 1.7 eV to 2.4 eV. The band gap of the oxide semiconductor film obtained in Comparative Example 5 is approximately 2.7 eV to 3.2 eV. Therefore, the introduction of a large amount of nitrogen into the film caused a significant increase in photo sensitivity in the visible region. A change in band gap of the In—Zn—Ga—ON film according to Example 7 was not observed even in the case of atmospheric annealing at 300° C. and thus the heat stability was found to be excellent.

Resistivity was measured before and after the annealing. As a result, the resistivity value was 1 kΩ·cm to a value equal to or larger than a measurement limit (measurement limit: approximately 10 MΩ·cm), which depends on the composition. However, when compared at the same metal composition ratio, a change in resistivity was hardly observed and thus the heat stability was found to be excellent in terms of electrical characteristics.

The thin film produced in Example 7 was subjected to two-dimensional X-ray diffraction measurement. As a result, it was confirmed that, although the different lattice constants are obtained, the same pattern (see FIG. 18) as in the result obtained by simulation (FIG. 12) of ZnO having the wurtzite structure was observed and thus the entire thin film was formed by the In—Zn—Ga—ON film having the atomic configuration of a wurtzite structure. Note that the composition of the measured film was obtained by fluorescent X-ray analysis and Rutherford backscattering spectrometry (RBS) analysis. It was found that the atomic composition ratios of In, Zn, and Ga to the total number of metal atoms were approximately 18 atomic percent, approximately 55 atomic percent, and approximately 27 atomic percent, respectively. It was found that the atomic composition ratio of nitrogen which is expressed by N/(N+O) was approximately 40 atomic percent and the atomic composition ratio of metal which is expressed by (In+Zn+Ga)/(In+Zn+Ga+N+O) was approximately 49 atomic percent. On the other hand, in the case of the oxide film obtained in Comparative Example 5, it was found that a diffraction peak was not observed in a composition region in which the atomic composition ratio of Zn to the total number of metal atoms is equal to or smaller than 70 atomic percent and thus the film was amorphous. In a composition region in which the atomic composition ratio of Zn to the total number of metal atoms is larger than 70 atomic percent, a diffraction peak resulting from $InGaO_3(ZnO)_x$ having a homologous structure was observed.

The lattice constants were derived from the result obtained by the X-ray diffraction measurement. As a result, the c-axis length was approximately 0.54 nm to 0.57 nm, which depends on composition ratio.

Next, in order to examine the temporal stability of the In—Zn—Ga—ON film, the oxynitride film produced in Example 7 was left at rest in the atmosphere at a temperature of 20° C. and a humidity of 50%, and the temporal change in resistivity was measured. As a result, the change in resistivity was not observed and thus the environmental stability was found to be excellent.

As described above, when the oxynitride semiconductor containing In, Ga, and Zn was formed, it was found that a semiconductor whose residual carrier concentration is low and whose band gap can be adjusted in the visible region could be realized at room temperature, and thus the semiconductor could be applied to, for example, a light absorption layer of a high-efficiency solar cell.

Example 8

Transistor using In—Zn—Ga—ON for Active Layer

In this example, a bottom-gate Zn—Ga—ON thin film transistor illustrated in FIG. 15 was manufactured.

In this example, in order to examine the dependency of the active layer on the atomic composition ratio, a combinatorial method is used for film formation. That is, the dependency is examined using a method of simultaneously forming oxynitride thin films having various compositions on a single substrate by sputtering. Note that the method is not necessarily used. A material source (target) having a predetermined composition may be prepared to form an oxynitride thin film or input powers for multiple targets may be controlled to form a thin film having a desirable composition.

An In—Zn—Ga—ON oxynitride film used as an active layer 12 was deposited on a silicon substrate with a thermally oxidized film in an atmosphere containing a mixture of argon and nitrogen by RF sputtering. In this example, the thermally oxidized film serves as a gate insulating film 14 and the silicon substrate also serves as a gate electrode 15. The film thickness of the thermally oxidized film is 100 nm A 2-inch sintered material having a composition of $In_2O_3$, a 2-inch sintered material having a composition of ZnO, and a 2-inch sintered material having a composition of GaN (each of which has a purity of 99.9%) were used as targets (material sources). Input RF powers are 30 W ($In_2O_3$), 50 W (ZnO), and 60 W (GaN). The distance between each of the targets and the substrate was set to approximately 7 cm to 12 cm. The substrate temperature during film formation was set to 25° C. The In—Zn—Ga—ON film was formed in the atmosphere containing the mixture of argon and nitrogen of $4\times10^{-1}$ Pa. The introduced nitrogen partial pressure was set to $3.2\times10^{-1}$ Pa.

After that, a Ti layer whose thickness is approximately 5 nm and an Au layer whose thickness is approximately 100 nm were laminated in the stated order from the side close to the channel layer of the oxide semiconductor by an electron beam heating deposition method. Thus, an adhesion layer 16 for improving adhesion, a source electrode 12, and a drain electrode 13 were formed. The channel length was 10 μm and the channel width was 150 μm.

The TFT manufactured by the method described above was heated in the atmosphere at 400° C. for one hour. The resultant In—Zn—Ga—ON film was subjected to four-probe measurement. As a result, it was found that the resistivity was equal to or larger than 0.1 Ωcm. The obtained oxynitride film was measured by a step meter. As a result, the film thickness was approximately 20 nm (Characteristic Evaluation of TFT Device)

Figure 19:
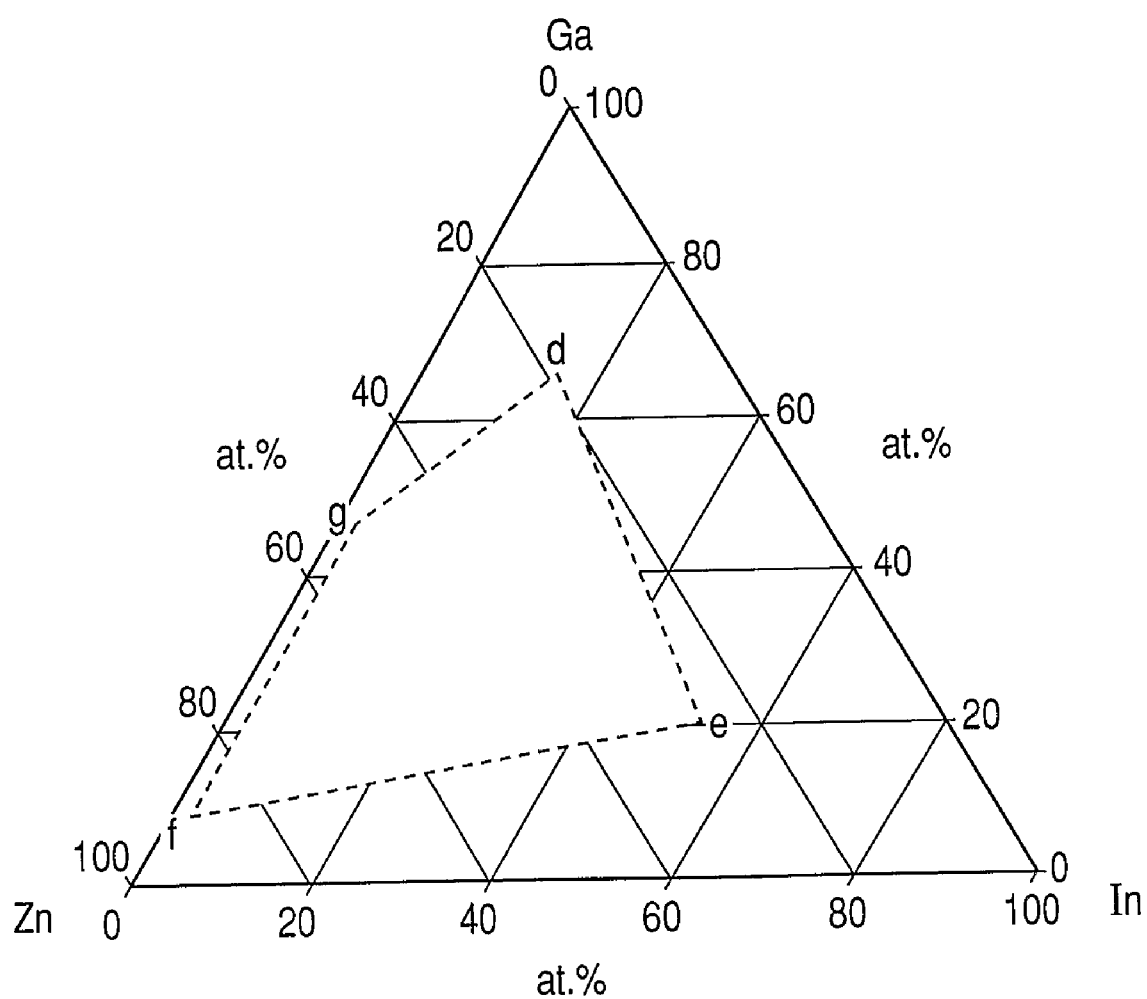
FIG. 19 is a ternary phase diagram illustrating a metal composition range of a TFT active layer with which an excellent transistor characteristic is obtained in Example 8.
Figure 20:
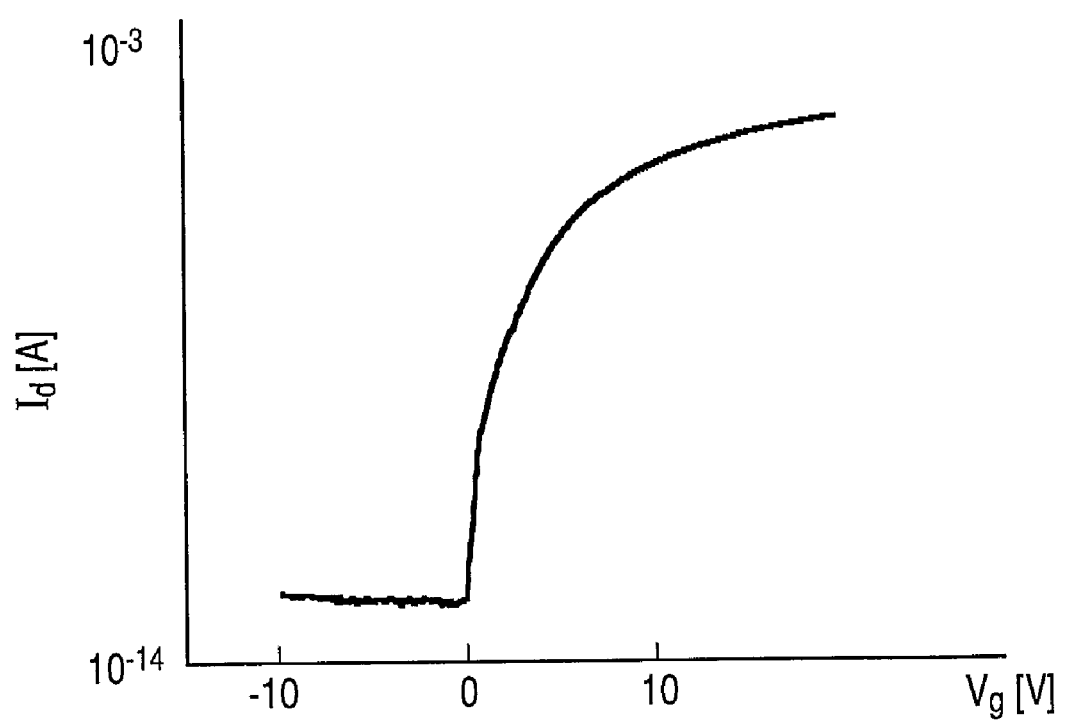
FIG. 20 is a graph illustrating a typical TFT characteristic of a thin film transistor manufactured in Example 8.

Excellent transistor characteristics were obtained in a composition range in which the atomic composition ratios of In, Zn, and Ga to the total number of metal atoms were approximately 2 atomic percent to 50 atomic percent, approximately 18 atomic percent to 88 atomic percent, and approximately 8 atomic percent to 67 atomic percent. The current on/off ratio was equal to or larger than $10^5$ in this composition range. FIG. 19 is a ternary phase diagram illustrating a metal composition range of the active layer of the TFT in which the excellent transistor characteristics were obtained in this example (region surrounded by the lines connecting points "d", "e", "f", and "g" of FIG. 19). FIG. 20 illustrates an example of the Id-Vg characteristic (transfer characteristic) at Vd=6 V in the case where the TFT device manufactured in this example is measured at room temperature. According to the result obtained by fluorescent X-ray analysis and Rutherford backscattering spectrometry (RBS) analysis, it is found that the atomic composition ratios of In, Zn, and Ga to the total number of metal atoms are approximately 21 atomic percent, approximately 42 atomic percent, and approximately 35 atomic percent, and the atomic composition ratio of nitrogen which is expressed by N/(N+O) is approximately 45 atomic percent. It was found that the on-current was relatively large and thus a current Id of approximately $1\times10^{-4}$ A flowed at Vg=20 V. The field effect mobility was calculated from the output characteristic. As a result, a field effect mobility of approximately 2 cm$^2$/Vs was obtained in the saturation region. The current on/off ratio exceeded approximately $10^9$. The S-value was approximately 0.6 V/dec. Therefore, the desirable values were obtained as compared with Example 3. In this example, a so-called normally-off characteristic in which the current does not flow when a gate voltage is 0 V could be realized. This reason may be that a low residual carrier concentration could be obtained by Ga used as a constituent element.

Next, in order to examine the temporal stability of the TFT manufactured in this example, the TFT was left at rest in the atmosphere at a temperature of 20° C. and a humidity of 50% to measure the temporal changes in TFT characteristics. As a result, the changes in TFT characteristics were not observed even after the TFT was left for half a year and thus the environmental stability thereof was found to be excellent.

Thus, it was confirmed that the TFT operation was realized even when the oxynitride semiconductor film whose nitrogen concentration was high was used as the active layer. When the oxynitride semiconductor film was used as the active layer of the TFT, it was possible to realize a normally-off TFT having excellent characteristics such as a field effect mobility of approximately 2 cm$^2$/Vs, a current on/off ratio which exceeds approximately $10^9$, and an S-value of approximately 0.6 V/dec.

Example 9

Optical Response Characteristic of In—Zn—Ga—ON

In this example, an In—Zn—Ga—ON film was formed on a glass substrate in an atmosphere containing a mixture of argon and nitrogen by RF sputtering.

The In—Zn—Ga—ON oxynitride film was deposited on the glass substrate in the atmosphere containing the mixture of argon and nitrogen by RF sputtering. A 2-inch sintered material having a composition of In$_2$O$_3$, a 2-inch sintered material having a composition of ZnO, and a 2-inch sintered material having a composition of GaN (each of which has a purity of 99.9%) were used as targets (material sources). Input RF powers are 30 W (In$_2$O$_3$), 50 W (ZnO), and 60 W (GaN). The distance between each of the targets and the substrate was set to approximately 7 cm to 12 cm. The substrate temperature during film formation was set to 25° C. The In—Zn—Ga—ON film was formed in the atmosphere containing the mixture of argon and nitrogen of $4\times10^{-1}$ Pa. The introduced nitrogen partial pressure was set to $3.2\times10^{-1}$ Pa. The substrate is rotated at a rotation speed of 10 revolutions per minute during film formation.

After that, a Ti layer whose thickness is approximately 5 nm and an Au layer whose thickness is approximately 40 nm were laminated in the stated order from the side close to the channel layer of the oxynitride semiconductor by an electron beam heating deposition method. The interelectrode distance is 30 μm and the electrode width is 450 μm. Then, the oxynitride film produced by the method described above was heated in the atmosphere at 400° C. for one hour. The resultant In—Zn—Ga—ON film had a conductivity of approximately $10^{-6}$ S/m and a film thickness of approximately 20 nm. According to the result obtained by fluorescent X-ray analysis and Rutherford backscattering spectrometry (RBS) analysis, it has been found that the atomic composition ratios of In, Zn, and Ga to the total number of metal atoms are approximately 21 atomic percent, approximately 42 atomic percent, and approximately 35 atomic percent, and the atomic composition ratio of nitrogen which is expressed by N/(N+O) is approximately 45 atomic percent.

(Evaluation of Photoconductivity)

FIG. 21 illustrates conductivities of the In—Zn—Ga—ON film irradiated with light at different wavelengths. An illumination intensity is 0.2 mW/cm$^2$ at each of the wavelengths. It was found that the conductivity was approximately $10^{-1}$ S/m at the time of irradiation with light whose wavelength is 300 nm and thus the conductivity was increased by approximately four orders of magnitude than in the case of non-irradiation. In addition, it was found that the conductivity increased even in the case of irradiation with light whose wavelength is 400 nm to 600 nm and thus the film was also sensitive to visible light. FIG. 22 is a graph illustrating an optical response characteristic to light having a wavelength of 500 nm. Current could be switched on/off by the on/off control of light irradiation.

Therefore, it was found that the oxynitride semiconductor according to the present invention could be used for a light receiving device such as a sensor or a solar cell and applied to a device which requires sensitivity to visible light as well.

Example 10

Zn—Ge—ON Film, Zn/(Zn+Ge): 50 Atomic Percent to 90 Atomic Percent

In this example, a Zn—Ge—ON film was formed on a silicon substrate with a thermally oxidized film (300 nm) in an atmosphere containing a mixture of argon and nitrogen by RF sputtering.

In this example, in order to examine the dependency of the film on the atomic composition ratio, a combinatorial method was used for film formation. That is, the dependency is examined using a method of simultaneously forming oxynitride thin films having various compositions on a single substrate by sputtering. Note that the method is not necessarily used. A material source (target) having a predetermined composition may be prepared to form an oxynitride thin film or input powers for multiple targets may be controlled to form a thin film having a desirable composition.

The Zn—Ge—ON film was formed using a co-sputtering apparatus with diagonal incidence configuration. Targets are located in a diagonal direction relative to the substrate, so the composition of the film varies depending on differences in distances from the targets. Therefore, a thin film having a wide composition distribution can be obtained.

A 2-inch sintered material having a composition of ZnO and a 2-inch sintered material having a composition of Ge (each of which has a purity of 99.9%) were used as the targets (material sources). Input RF powers are 40 W (ZnO) and 30 W (Ge). The distance between each of the targets and the substrate was set to approximately 7 cm to 12 cm. The substrate temperature during film formation was set to 25° C. The Zn—Ge—ON film was formed in the atmosphere containing the mixture of argon and nitrogen of $4 \times 10^{-1}$ Pa. The introduced nitrogen partial pressure was set to $3.2 \times 10^{-1}$ Pa.

The obtained oxynitride film was measured by a step meter. As a result, the film thickness was 400 nm Fluorescent X-ray analysis was performed. As a result, it was found that the atomic composition ratio of Zn which is expressed by Zn/(Zn+Ge) was 50 atomic percent to 90 atomic percent. Fluorescent X-ray analysis and Rutherford backscattering spectrometry (RBS) analysis were performed. As a result, it was found that the atomic composition ratio of Zn which is expressed by Zn/(Zn+Ge) was approximately 70 atomic percent at the center of the substrate and the atomic composition ratio of nitrogen which is expressed by N/(N+O) was approximately 50 atomic percent at the center of the substrate.

X-ray diffraction measurement was performed. As a result, it was confirmed that a diffraction peak was detected around 2θ=34, in a composition range in which the atomic composition ratio of Zn which is expressed by Zn/(Zn+Ge) was equal to or larger than approximately 65 atomic percent. In addition, it was confirmed that the formed film was crystallized in this composition range.

(Film Characteristics)

Electrical characteristics of the oxynitride semiconductor obtained in this example were evaluated by hole measurement. As a result, the electrical characteristic values were equal to or smaller than the measurement limits, so a low carrier concentration state could be realized.

Optical absorption spectral analysis was performed. As a result, the band gap of the oxynitride film produced in Example 10 was equal to or smaller than 2.3 eV. In particular, the band gap was a substantially constant value of approximately 1.7 eV, in the composition range in which the diffraction peak was observed by the X-ray diffraction measurement, that is, in the composition range in which the atomic composition ratio of Zn which is expressed by Zn/(Zn+Ge) is equal to or larger than approximately 65 atomic percent. A change in band gap of the Zn—Ge—ON film according to this example was not observed even in the case of atmospheric annealing at 300° C. and thus the heat stability was also found to be excellent.

Resistivity was measured before and after the annealing. As a result, the resistivity value was approximately 500 kΩ·cm to a value equal to or larger than a measurement limit (measurement limit: approximately 10 MΩ·cm), which depends on the composition. However, in the case of the same composition, a change in resistivity was hardly observed, and thus the heat stability was found to be excellent in terms of electrical characteristics.

The thin film produced in this example was subjected to two-dimensional X-ray diffraction measurement. As a result, it was confirmed that, although the different lattice constants were obtained, the same pattern (see FIG. 23) as in the result obtained by simulation (FIG. 12) of ZnO having the wurtzite structure was observed, and thus the entire thin film was the Zn—Ge—ON film having the atomic configuration of wurtzite structure. Note that the composition of the measured film was obtained by fluorescent X-ray analysis and Rutherford backscattering spectrometry (RBS) analysis. It was found that the atomic composition ratio of Zn which is expressed by Zn/(Zn+Ge) was approximately 70 atomic percent. Similarly, it was found that the atomic composition ratio of nitrogen which is expressed by N/(N+O) was approximately 50 atomic percent.

The lattice constants were derived from the result obtained by the X-ray diffraction measurement. As a result, the c-axis length was approximately 0.52 nm and the a-axis length was approximately 0.33 nm.

Next, in order to examine the temporal stability of the Zn—Ge—ON film, the oxynitride film produced in this example was left at rest in the atmosphere at a temperature of 20° C. and a humidity of 50% and the temporal change in resistivity was measured. As a result, the change in resistivity was not observed and thus the environmental stability was found to be excellent.

As described above, when the oxynitride semiconductor containing Ge and Zn was formed, it was found that a semiconductor whose residual carrier concentration is low and whose band gap can be adjusted in the visible region could be realized at room temperature and the semiconductor could be applied to, for example, a light absorption layer of a high-efficiency solar cell.

Example 11

Zn—Si—ON Film, Zn/(Zn+Si): 50 Atomic Percent to 90 Atomic Percent

In this example, a Zn—Si—ON film was formed on a silicon substrate with a thermally oxidized film (300 nm) in an atmosphere containing a mixture of argon and nitrogen by RF sputtering.

In this example, in order to examine the dependency of the film on the atomic composition ratio, a combinatorial method was used for film formation. That is, the dependency was examined using a method of simultaneously forming oxynitride thin films having various compositions on a single substrate by sputtering. Note that the method is not necessarily used. A material source (target) having a predetermined composition may be prepared to form an oxynitride thin film or input powers for multiple targets may be controlled to form a thin film having a desirable composition.

The Zn—Si—ON film was formed using a co-sputtering apparatus with diagonal incidence configuration. Targets are located in a diagonal direction relative to the substrate, so the composition of the film varies depending on differences in distances from the targets. Therefore, a thin film having a wide composition distribution can be obtained.

A 2-inch sintered material having a composition of ZnO and a 2-inch sintered material having a composition of $Si_3N_4$ (each of which has a purity of 99.9%) were used as the targets (material sources). Input RF powers are 30 W (ZnO) and 180 W ($Si_3N_4$). The distance between each of the targets and the substrate was set to approximately 7 cm to 12 cm. The substrate temperature during film formation was set to 25° C. The Zn—Si—ON film was formed in the atmosphere containing the mixture of argon and nitrogen of $4 \times 10^{-1}$ Pa. The introduced nitrogen partial pressure was set to $3.2 \times 10^{-1}$ Pa.

The obtained oxynitride film was measured by a step meter. As a result, the film thickness was 400 nm Rutherford backscattering spectrometry (RBS) analysis was performed. As a result, it was found that the atomic composition ratio of Zn which is expressed by Zn/(Zn+Si) was 50 atomic percent to 90 atomic percent. The atomic composition ratio of Zn which is expressed by Zn/(Zn+Si) was approximately 80 atomic percent at the center of the substrate and the atomic composition ratio of nitrogen which is expressed by N/(N+O) was approximately 32 atomic percent at the center of the substrate.

X-ray diffraction measurement was performed. As a result, it was confirmed that a diffraction peak was detected around $2\theta=34.5°$, in a composition range in which the atomic composition ratio of Zn which is expressed by Zn/(Zn+Si) was equal to or larger than approximately 80 atomic percent. In addition, it was confirmed that the formed film was crystallized in this composition range.

(Film Characteristics)

Electrical characteristics of the oxynitride semiconductor obtained in this example were evaluated by hole measurement. As a result, the electrical characteristic values were equal to or smaller than the measurement limits, so a low carrier concentration state could be realized.

Optical absorption spectral analysis was performed. As a result, the band gap of the oxynitride film produced in Example 11 was equal to or smaller than approximately 4.5 eV. In particular, the band gap was a value equal to or smaller than 2 eV, in the composition range in which the diffraction peak is observed by the X-ray diffraction measurement, that is, in the composition range in which the atomic composition ratio of Zn which is expressed by Zn/(Zn+Si) is equal to or larger than approximately 80 atomic percent.

A change in band gap of the Zn—Si—ON film according to this example was not observed even in the case of atmospheric annealing at 300° C. and thus the heat stability was also found to be excellent.

Resistivity was measured before and after the annealing. As a result, the resistivity value was approximately 800 kΩ·cm to a value equal to or larger than a measurement limit (measurement limit: approximately 10 MΩ·cm), which depends on the composition. However, at the same metal composition ratio, this resistivity was hardly observed and thus the heat stability was found to be excellent in terms of electrical characteristics.

The thin film produced in this example was subjected to two-dimensional X-ray diffraction measurement. As a result, it was confirmed that, although the different lattice constants were obtained, the same pattern (see FIG. 24) as in the result obtained by simulation (FIG. 12) of ZnO having the wurtzite structure was observed, and thus the entire thin film was the Zn—Si—ON film having the atomic configuration of wurtzite structure. Note that the composition of the measured film was obtained by Rutherford backscattering spectrometry (RBS) analysis. It was found that the atomic composition ratio of Zn which is expressed by Zn/(Zn+Si) was approximately 85 atomic percent and the atomic composition ratio of nitrogen which is expressed by N/(N+O) was approximately 22 atomic percent.

The lattice constants were derived from the result obtained by the X-ray diffraction measurement. As a result, the c-axis length was approximately 0.52 nm and the a-axis length was approximately 0.32 nm.

Next, in order to examine the temporal stability of the Zn—Si—ON film, the oxynitride film produced in this example was left at rest in the atmosphere at a temperature of 20° C. and a humidity of 50% and the temporal change in resistivity was measured. As a result, the change in resistivity was not observed and thus the environmental stability was found to be excellent.

As described above, when the oxynitride semiconductor containing Si and Zn was formed, it was found that a semiconductor whose residual carrier concentration is low and whose band gap can be adjusted in the visible region to the ultraviolet region could be realized at room temperature and the semiconductor could be applied to, for example, a light absorption layer of a high-efficiency solar cell.

Example 12

In this example, crystal structures and electronic states of the oxynitride semiconductor were studied. In particular, the elemental arrangement of a ZnInON crystal was studied based on the wurtzite structure.

A first-principles electronic state calculation method was used to study the elemental arrangement. In this example, a first-principles electronic state calculation program software "Cambridge Serial Total Energy Package (CASTEP)" (produced by Accelrys Inc.) was used for electronic state calculation and the elemental arrangement was calculated by the density functional theory (DFT) with the generalized gradient approximation (GGA). When total energies obtained as a result of calculation using the density functional theory for various elemental arrangements are compared with one another, the stability of the material can be evaluated. The cutoff energy was set to 380 eV and the structural optimization of the following initial structures (positional optimization of respective atomic positions) was performed.

Figure 25A:
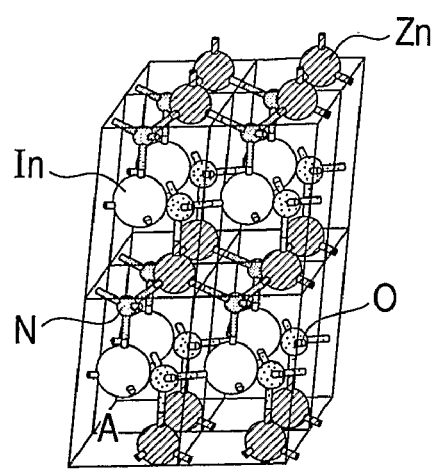
FIGS. 25A, 25B and 25C illustrate examples of a ZnInON crystal structure.
Figure 25B:
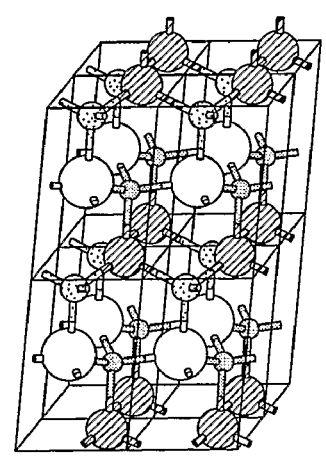
Figure 25C:
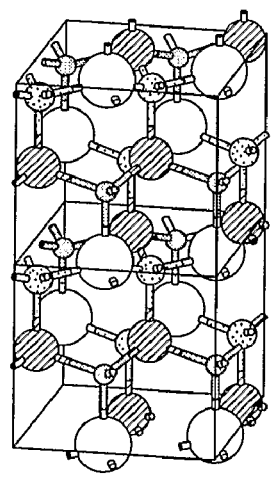

FIGS. 25A to 25C illustrate examples of the three initial structures used for the calculation. In the atomic arrangement of the wurtzite structure, In and Zn are arranged in the cation sites and O and N are arranged in the anion sites. The content ratio of Zn, In, O, and N is 1:1:1:1 but the three arrangements are different in elemental sequence from one another. Hereinafter, the features of the three structures will be described.

Arrangement-A (FIG. 25A): to each In atom one N atom and three O atoms coordinate and to each Zn atom one O atom and three N atoms coordinate. This arrangement can be considered to be a structure in which a layer made of In—O and a layer made of Zn—N are laminated in the c-axis direction of the wurtzite structure. The symmetry is classified into a trigonal system with the space group P3M1.

Arrangement-B (FIG. 25B): to each In atom three N atoms and one O atom coordinate and to each Zn atom three O atoms and one N atom coordinate. This arrangement can be considered to be a structure in which a layer made of In—N and a layer made of Zn—O are laminated in the c-axis direction of the wurtzite structure. The symmetry is classified into a trigonal system with the space group P3M1.

Arrangement-C (FIG. 25C): to each In atom two N atoms and two O atoms coordinate and to each Zn atom two O atoms and two N atoms coordinate. This arrangement can be considered to be a structure in which chains of In—O and chains of Zn—O are arranged. The symmetry is classified into an orthorhombic system with the space group PNA21.

The respective total energies obtained by the results of the calculation were as follows.
Arrangement-A −3978.1401 eV
Arrangement-B −3978.5956 eV
Arrangement-C −3978.6336 eV
Therefore, it was found that Arrangement-C was most stable. As a result, Arrangement-C is desirable as the crystal structure of the ZnInON crystal.

FIG. 26A illustrates the ZnInON structure after the structural optimization in the case of Arrangement-C and FIG. 26B is a band diagram thereof. As compared with the initial structure, a change in atomic position is observed. The interatomic distance is changed according to the combination of elements. The longest interatomic distance is the distance of In—O, and the interatomic distance decreases in the order of In—N, Zn—O, and Zn—N. The distance of In—N in the ZnInON structure was shorter than the distance of In—N in an InN structure which is separately calculated. The distance of Zn—O in the ZnInON structure was longer than the distance of Zn—O in a ZnO structure which is separately calculated. As is apparent from the band diagram of FIG. 26B, the ZnInON crystal is a direct transition semiconductor. According to the density functional theory, the band gap is underestimated, so the band gap Eg of the ZnInON crystal is close to 0. However, the obtained band gap was smaller than the band gap Eg of ZnO and larger than the band gap Eg of InN. Therefore, it is found that the band gap Eg of the ZnInON crystal can be controlled by adjusting the elemental composition thereof. This matches with the results described in the examples.

The electronic state density was analyzed. As a result, it was found that the valence band maximum mainly included a p-orbital component of N. Although the band of the valence band maximum of a general oxide has little dispersion, the band of the valence band maximum of the ZnInON crystal has dispersion. This exhibits that the effective hole mass is small and thus conduction is possible. On the other hand, the conduction band minimum mainly includes an s-orbital component of In and further includes a mixed p-orbital component of O (and N), thereby forming a band whose dispersion is large. This exhibits that the effective electron mass in the ZnInON crystal is small, which thus matches with the results in which the large electron mobilities were obtained in the examples described above.

Next, the elemental arrangement of a ZnGaON crystal was calculated as in the case of the ZnInON crystal. The ZnGaON crystal has such an elemental arrangement that all the In atoms are replaced by Ga atoms in the ZnInON crystal.

The total energies obtained by calculation were as follows.
Arrangement-A −4471.1808 eV
Arrangement-B −4472.1881 eV
Arrangement-C −4472.0024 eV
Therefore, Arrangement-B was most stable. That is, Arrangement-B is desirable as the crystal structure of the ZnGaON crystal. The ZnGaON crystal had a direct transition band structure and the band gap thereof was larger than the band gap of the ZnInON crystal.

As described above, the semiconductor containing ZnInON or ZnGaON according to the present invention may have the cation grains of Zn and In and the anion grains of O and N which form the atomic arrangement of the wurtzite structure. In particular, the elemental arrangement such as Arrangement-C or Arrangement-B is a desirable structure. It was found that these materials were found to be a semiconductor whose effective electron mass is small and whose band gap can be adjusted according to the element composition.

In this example, the specific elemental arrangements were calculated. However, the arrangement of the respective elements (Zn, In, O, and N) on the semiconductor according to the present invention is not limited to the above-mentioned cases. Arrangement-A or another structure in which the respective elements are arranged in the atomic positions of the wurtzite structure at random can be employed depending on a material producing method.

INDUSTRIAL APPLICABILITY

The oxynitride semiconductor according to the present invention can be applied to a thin film transistor, a thin film diode, a light receiving device, and a solar cell, each of which has a substrate such as a glass substrate, a plastic substrate, or a plastic film.

This application claims the benefit of Japanese Patent Application No. 2007-115634, filed Apr. 25, 2007, Japanese Patent Application No. 2007-288689, filed Nov. 6, 2007 and Japanese Patent Application No. 2008-109054, filed Apr. 18, 2008 which are hereby incorporated by reference herein in their entirety.

The invention claimed is:

1. An oxynitride semiconductor comprising a metal oxynitride, wherein the metal of the metal oxynitride consists essentially of Zn and In, and wherein the metal oxynitride has an atomic composition ratio of N, N/(N+O), of 7 atomic percent or more to 80 atomic percent or less, and wherein the metal oxynitride is a crystal having an atomic arrangement of a wurtzite structure.

2. An oxynitride semiconductor according to claim 1, wherein the metal oxynitride has a band gap of 1 eV or more to 2 eV or less.

3. An oxynitride semiconductor according to claim 1, wherein the metal oxynitride has an atomic composition ratio of Zn atoms to the total number of metal atoms of 50 atomic percent or more.

4. A thin-film transistor comprising an oxynitride semiconductor according to claim 1, wherein the oxynitride semiconductor is incorporated in the thin-film transistor as an active layer thereof.

5. A light-receiving device comprising an oxynitride semiconductor according to claim 1, wherein the oxynitride semiconductor is incorporated in the light-receiving device as a light receiving layer thereof.

* * * * *